(12) United States Patent
Mori et al.

(10) Patent No.: US 10,077,337 B2
(45) Date of Patent: Sep. 18, 2018

(54) POLYIMIDE, RESIN FILM, AND METAL-CLAD LAMINATE

(71) Applicant: NIPPON STEEL & SUMIKIN CHEMICAL CO., LTD., Tokyo (JP)

(72) Inventors: Akira Mori, Chiba (JP); Aiko Hara, Chiba (JP); Eigo Kondo, Chiba (JP); Tomonori Ando, Chiba (JP)

(73) Assignee: NIPPON STEEL & SUMIKIN CHEMICAL CO., LTD., Tokyo (JP)

( * ) Notice: Subject to any disclaimer, the term of this patent is extended or adjusted under 35 U.S.C. 154(b) by 205 days.

(21) Appl. No.: 14/901,089

(22) PCT Filed: Jun. 26, 2014

(86) PCT No.: PCT/JP2014/066929
§ 371 (c)(1),
(2) Date: Dec. 28, 2015

(87) PCT Pub. No.: WO2014/208644
PCT Pub. Date: Dec. 31, 2014

(65) Prior Publication Data
US 2017/0321011 A1    Nov. 9, 2017

(30) Foreign Application Priority Data

Jun. 28, 2013  (JP) .................................. 2013-137129
Mar. 28, 2014  (JP) .................................. 2014-069005

(51) Int. Cl.
| C08G 73/10 | (2006.01) |
| C09D 179/08 | (2006.01) |
| C08J 7/04 | (2006.01) |
| B32B 27/28 | (2006.01) |
| B32B 15/08 | (2006.01) |
| H05K 1/03 | (2006.01) |

(52) U.S. Cl.
CPC .......... *C08G 73/1082* (2013.01); *B32B 15/08* (2013.01); *B32B 27/281* (2013.01); *C08G 73/105* (2013.01); *C08G 73/1042* (2013.01); *C08J 7/047* (2013.01); *C09D 179/08* (2013.01); *H05K 1/036* (2013.01); *C08J 2379/08* (2013.01); *H05K 2201/0154* (2013.01)

(58) Field of Classification Search
CPC ............ C08G 73/1007; C08G 73/1075; B32B 2379/08
See application file for complete search history.

(56) References Cited

U.S. PATENT DOCUMENTS 5,655,276 A * 8/1997 Pattanayak ........... B06B 1/0629
29/25.35

FOREIGN PATENT DOCUMENTS

| JP | 2004-358961 | 12/2004 |
| JP | 2013-001730 | 1/2013 |
| JP | 2013-112735 | * 6/2013 |
| JP | 2013-155329 | 8/2013 |
| JP | 2013-199646 | 10/2013 |

OTHER PUBLICATIONS

"International Search Report (Form PCT/ISA/210) of PCT/JP2014/066929", dated Sep. 22, 2014, with English translation thereof, pp. 1-4.

* cited by examiner

*Primary Examiner* — Gregory Listvoyb
(74) *Attorney, Agent, or Firm* — JCIPRNET

(57) ABSTRACT

A resin film, in which at least one of polyimide layers is a non-thermoplastic polyimide layer having a linear thermal expansion coefficient of $1 \times 10^{-6}$ to $30 \times 10^{-6}$ (1/K), is shown. The non-thermoplastic polyimide layer is composed of a polyimide which is produced by reacting an anhydride component containing an aromatic tetracarboxylic anhydride with a diamine component, wherein the diamine component contains both a dimer acid-type diamine produced by replacing each of two terminal carboxyl groups in a dimer acid with a primary aminomethyl or amino group and an aromatic diamine, and the dimer acid-type diamine is contained in an amount of 1 to 15 mol % relative to the whole diamine component.

5 Claims, 2 Drawing Sheets

POLYIMIDE, RESIN FILM, AND METAL-CLAD LAMINATE

CROSS-REFERENCE TO RELATED APPLICATION

This application is a 371 application of the International PCT application serial no. PCT/JP2014/066929, filed on Jun. 26, 2014, which claims the priority benefits of Japan application serial no. 2013-137129, filed on Jun. 28, 2013, and Japan application serial no. 2014-069005, filed on Mar. 28, 2014. The entirety of each of the above-mentioned patent applications is hereby incorporated by reference herein and made a part of this specification.

FIELD OF THE INVENTION

The invention relates to a polyimide, and a resin film and a metal-clad laminate using this polyimide.

DESCRIPTION OF THE RELATED ART

Recently, with advances in miniaturization, weight reduction and space-saving of electronic devices, there is an increasing demand for flexible printed circuits (FPC) that are thin, lightweight, flexible, and exhibit excellent durability even if being repeatedly bent. Since 3D and high-density mounting of FPCs in a limited space is possible, their application is expanding in, e.g., wiring of movable parts of electronic devices such as HDD, DVD and mobile phones, etc., or components such as cables and connectors, etc.

In addition to the aforementioned increased density, device performance has been improved, and measures against an increase in frequency of transmission signals are therefore also considered necessary. During transmission of high-frequency signals, if there is a point at which impedance changes in the signal transmission path, electromagnetic wave reflection occurs at that point, and inconveniences such as loss of electrical signals or deformation of signal waveform are caused. Hence, the impedance matching of FPCs becomes an important characteristic. In order to cope with increased frequency, FPCs using a liquid crystal polymer characterized by low dielectric constant and low dielectric tangent as a dielectric layer are used. However, while the liquid crystal polymer has excellent dielectric characteristics, there is room for improvement in its heat resistance or adhesiveness to metal foil.

To improve heat resistance or adhesiveness, a metal-clad laminate using polyimide as an insulating layer has been proposed (Patent Document 1). According to Patent Document 1, generally, it is known that the dielectric constant of a polymer material is reduced by using an aliphatic monomer. Since a polyimide obtained using an aliphatic (chain) tetracarboxylic dianhydride has remarkably low heat resistance, it cannot be subjected to processing such as soldering and so on, which becomes a problem in practice. When an alicylic tetracarboxylic dianhydride is used, a polyimide can be obtained having improved heat resistance as compared to that obtained from the chain tetracarboxylic dianhydride. Such polyimide film, however, while having a dielectric constant of not greater than 3.2 at 10 GHz, has a dielectric tangent of greater than 0.01, and does not have sufficient dielectric characteristics.

PRIOR-ART DOCUMENTS

Patent Documents

Patent Document 1: JP 2004-358961 A

SUMMARY OF THE INVENTION

Problems to Be Solved by the Invention

The invention provides a polyimide, a resin film and a metal-clad laminate that can cope with increased frequency associated with size reduction and performance improvement of electronic devices.

Means for Solving the Problems

To solve the aforementioned problems, the inventors have discovered that a polyimide having a specific diamine structure has a low dielectric tangent, and that by using this polyimide in an insulating resin layer, a circuit board such as an FPC that has good impedance matching in a high-frequency region can be obtained, thereby accomplishing this invention.

That is, a resin film according to a first aspect of the invention is a resin film having one or a plurality of polyimide layers, wherein at least one of the polyimide layers is a non-thermoplastic polyimide layer having a linear thermal expansion coefficient of $1\times10^{-6}$ to $30\times10^{-6}$ (1/K). The resin film according to the first aspect of the invention is characterized in that the non-thermoplastic polyimide layer is composed of a polyimide which is produced by reacting an anhydride component containing an aromatic tetracarboxylic anhydride with a diamine component, wherein the diamine component contains both a dimer acid-type diamine produced by replacing each of two terminal carboxyl groups in a dimer acid with a primary aminomethyl or amino group and an aromatic diamine, and the dimer acid-type diamine is contained in an amount of 1 to 15 mol % relative to the whole diamine component.

In the resin film according to the $1^{st}$ aspect of the invention, the dimer acid-type diamine may be contained in an amount of 4 to 15 mol % relative to the whole diamine component.

In the resin film according to the first aspect of the invention, the aromatic tetracarboxylic anhydride may be one or more selected from the group consisting of pyromellitic dianhydride (PMDA), 3,3',4,4'-biphenyl tetracarboxylic dianhydride (BPDA), 3,3',4,4'-benzophenone tetracarboxylic dianhydride (BTDA) and 3,3',4,4'-diphenylsulfonetetracarboxylic dianhydride (DSDA).

In the resin film according to the first aspect of the invention, the aromatic diamine may be one or more selected from the group consisting of 2,2'-divinyl-4,4'-diaminobiphenyl (VAB), 2,2'-dimethyl-4,4'-diaminobiphenyl (m-TB), 2,2'-diethyl-4,4'-diaminobiphenyl, 2,2',6,6'-tetramethyl-4,4'-diaminobiphenyl, 2,2'-diphenyl-4,4'-diaminobiphenyl and 9,9-bis(4-aminophenyl)fluorene.

In the resin film according to the first aspect of the invention, the non-thermoplastic polyimide layer may be a base film layer, and the resin film may have a thermoplastic polyimide layer laminated on the base film layer. In this case, the thermoplastic polyimide layer may be composed of a polyimide which is produced by reacting an anhydride component containing an aromatic tetracarboxylic anhydride with a diamine component, wherein the diamine component contains both a dimer acid-type diamine produced by replacing each of two terminal carboxyl groups in a dimer acid with a primary aminomethyl or amino group and an aromatic diamine, and the dimer acid-type diamine is contained in an amount of 1 to 15 mol % relative to the whole diamine component.

A metal-clad laminate according to a second aspect of the invention is a metal-clad laminate including an insulating resin layer and a metal layer, wherein the insulating resin layer has a plurality of polyimide layers including a base film layer, and the base film layer is a non-thermoplastic polyimide layer having a linear thermal expansion coefficient of $1 \times 10^{-6}$ to $30 \times 10^{-6}$ (1/K). The metal-clad laminate according to the second aspect of the invention is characterized in that the non-thermoplastic polyimide layer is composed of a polyimide which is produced by reacting an anhydride component containing an aromatic tetracarboxylic anhydride with a diamine component, wherein the diamine component contains both a dimer acid-type diamine produced by replacing each of two terminal carboxyl groups in a dimer acid with a primary aminomethyl or amino group and an aromatic diamine, and the dimer acid-type diamine is contained in an amount of 1 to 15 mol % relative to the whole diamine component.

In the metal-clad laminate according to the second aspect of the invention, the dimer acid-type diamine may be contained in an amount of 4 to 15 mol % relative to the whole diamine component.

In the metal-clad laminate according to the second aspect of the invention, the aromatic tetracarboxylic anhydride may be one or more selected from the group consisting of pyromellitic dianhydride (PMDA), 3,3',4,4'-biphenyl tetracarboxylic dianhydride (BPDA), 3,3',4,4'-benzophenone tetracarboxylic dianhydride (BTDA) and 3,3',4,4'-diphenylsulfonetetracarboxylic dianhydride (DSDA).

In the metal-clad laminate according to the second aspect of the invention, the aromatic diamine may be one or more selected from the group consisting of 2,2'-divinyl-4,4'-diaminobiphenyl (VAB), 2,2'-dimethyl-4,4'-diaminobiphenyl (m-TB), 2,2'-diethyl-4,4'-diaminobiphenyl, 2,2',6,6'-tetramethyl-4,4'-diaminobiphenyl, 2,2'-diphenyl-4,4'-diaminobiphenyl and 9,9-bis(4-aminophenyl)fluorene.

The metal-clad laminate according to the second aspect of the invention may include, as a layer in the insulating resin layer that contacts the metal layer, a thermoplastic polyimide layer laminated between the metal layer and the base film layer. In this case, the thermoplastic polyimide layer may be composed of a polyimide which is produced by reacting an anhydride component containing an aromatic tetracarboxylic anhydride with a diamine component, wherein the diamine component contains both a dimer acid-type diamine produced by replacing each of two terminal carboxyl groups in a dimer acid with a primary aminomethyl or amino group and an aromatic diamine, and the dimer acid-type diamine is contained in an amount of 1 to 15 mol % relative to the whole diamine component.

In the metal-clad laminate according to the second aspect of the invention, a surface of the metal layer that contacts the insulating resin layer may have a surface roughness Rz of 1.5 μm or less, and an Ra of 0.2 μm or less.

A polyimide according to a third aspect of the invention is a polyimide obtained by reacting an anhydride component containing an aromatic tetracarboxylic anhydride with a diamine component containing an aromatic diamine, wherein the anhydride component contains, relative to the whole anhydride component, 40 mol % or more of an aromatic tetracarboxylic anhydride selected from the group consisting of pyromellitic dianhydride and 1,4,5,8-naphthalenetetracarboxylic dianhydride. In the polyimide according to the third aspect of the invention, the diamine component contains, relative to the whole diamine component, 40 to 99 mol % of an aromatic diamine represented by the general formula below, and 1 to 4 mol % of a dimer acid-type diamine produced by replacing each of two terminal carboxyl groups in a dimer acid with a primary aminomethyl or amino group.

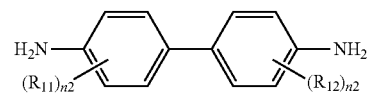

In the formula, $R_{11}$ and $R_{12}$ independently represent a hydrogen atom, or an alkyl group optionally substituted with a halogen atom or phenyl, at least two of $R_{11}$ and $R_{12}$ represent alkyl groups optionally substituted with a halogen atom or phenyl, and n2 is an integer of 1 to 4.

The polyimide according to the third aspect of the invention may have an imide group concentration of 33% or less. In addition, the anhydride component may contain 80 mol % or more of pyromellitic dianhydride relative to the whole anhydride component.

A resin film according to a fourth aspect of the invention is a resin film having one or a plurality of polyimide layers, wherein at least one of the polyimide layers is formed using the polyimide according to the third aspect of the invention.

A metal-clad laminate according to a fifth aspect of the invention is a metal-clad laminate including an insulating resin layer and a metal layer, wherein the insulating resin layer has one or a plurality of polyimide layers, and at least one of the polyimide layers is formed using the polyimide according to the third aspect of the invention.

Effects of the Invention

The resin film of the invention is formed using an aliphatic diamine having a specific structure as a raw material, and therefore has good visibility and low dielectric tangent, and can be suitably used as an electronic material needing high-speed signal transmission. Accordingly, by using the polyimide of the invention to form a resin substrate, wide application in resin films or metal-clad laminates becomes possible according to intended purposes.

DESCRIPTION OF THE EMBODIMENTS

Figure 1:
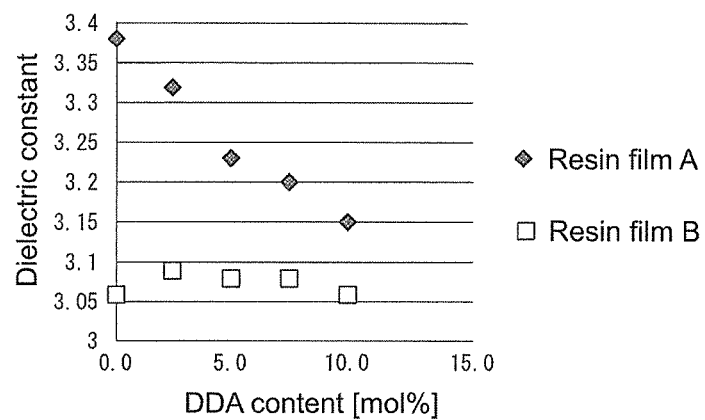
FIG. 1 is a graph showing measurement results of dielectric constant in Test Example 1.

The embodiments of the invention are hereinafter described.

First Embodiment

First of all, a polyimide preferably usable in the first embodiment (hereinafter sometimes referred to as "the polyimide of the first embodiment") is described.

[Polyimide of First Embodiment]

The polyimide of the first embodiment preferably has structural units represented by general formulae (1) and (2) below.

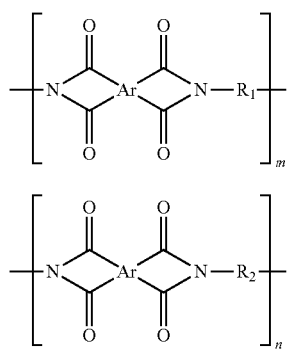

In the formulae, Ar represents a tetravalent aromatic group derived from an aromatic tetracarboxylic anhydride, $R_1$ represents a divalent dimer acid-type diamine residue derived from a dimer acid-type diamine, and $R_2$ represents a divalent aromatic diamine residue derived from an aromatic diamine, m and n represent the molar proportion of each constitutional unit, m ranges from 0.01 to 0.15, and n ranges from 0.85 to 0.99.

The group Ar can be exemplified by a group represented by formula (3) or (4) below.

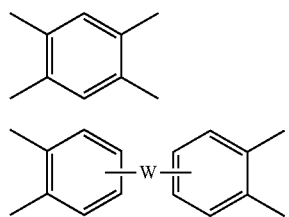

In the formula, W represents a single bond, a divalent hydrocarbon group having 1 to 15 carbons, or a divalent group selected from —O—, —S—, —CO—, —SO—, —SO$_2$—, —NH— and —CONH—.

Particularly, from the viewpoint of decreasing polar groups and improving dielectric characteristics of the polyimide, the group Ar is preferably represented by formula (3), or formula (4) in which W is a single bond, a divalent hydrocarbon group having 1 to 15 carbons, —O—, —S—, or —CO—, and is more preferably represented by formula (3), or formula (4) in which W is a single bond, a divalent hydrocarbon group having 1 to 15 carbons, or —CO—.

Moreover, the constitutional units represented by general formulae (1) and (2) may be present in a homopolymer or as constitutional units of a copolymer. A copolymer having a plurality of constitutional units may be present as a block copolymer or a random copolymer.

A polyimide is generally produced by reacting an anhydride with a diamine. Hence, by describing the anhydride and the diamine, specific examples of the polyimide of the first embodiment can be understood. In general formulae (1) and (2), the group Ar can be a residue of an anhydride, and the groups $R_1$ and $R_2$ can be residues of a diamine. Therefore, preferred polyimides are described according to the anhydride and the diamine.

Preferred examples of the anhydride having the group Ar as a residue include pyromellitic dianhydride, 3,3',4,4'-biphenyl tetracarboxylic dianhydride, 3,3',4,4'-diphenylsulfonetetracarboxylic dianhydride and 4,4'-oxydiphthalic anhydride. In addition, examples of the anhydride include 2,2',3,3'-, 2,3,3',4'- or 3,3',4,4'-benzophenonetetracarboxylic dianhydride, 2,3',3,4'-biphenyl tetracarboxylic dianhydride, 2,2',3,3'-biphenyl tetracarboxylic dianhydride, 2,3',3,4'-diphenyl ether tetracarboxylic dianhydride, bis(2,3-dicarboxyphenyl)ether dianhydride, 3,3'',4,4''-, 2,3,3'',4''- or 2,2'',3,3''-p-terphenyltetracarboxylic dianhydride, 2,2-bis(2,3- or 3,4-dicarboxyphenyl)propane dianhydride, bis(2,3- or 3,4-dicarboxyphenyl)methane dianhydride, bis(2,3- or 3,4-dicarboxyphenyl)sulfone dianhydride, 1,1-bis(2,3- or 3,4-dicarboxyphenyl)ethane dianhydride, 1,2,7,8-, 1,2,6,7- or 1,2,9,10-phenanthrene-tetracarboxylic dianhydride, 2,3,6,7-anthracenetetracarboxylic dianhydride, 2,2-bis(3,4-dicarboxyphenyl)tetrafluoropropane dianhydride, 2,3,5,6-cyclohexane dianhydride, 2,3,6,7-naphthalene tetracarboxylic dianhydride, 1,2,5,6-naphthalene tetracarboxylic dianhydride, 1,4,5,8-naphthalene tetracarboxylic dianhydride, 4,8-dimethyl-1,2,3,5,6,7-hexahydronaphthalene-1,2,5,6-tetracarboxylic dianhydride, 2,6- or 2,7-dichloronaphthalene-1,4,5,8-tetracarboxylic dianhydride, 2,3,6,7-(or 1,4,5,8-)tetrachloronaphthalene-1,4,5,8-(or 2,3,6,7-)tetracarboxylic dianhydride, 2,3,8,9-, 3,4,9,10-, 4,5,10,11- or 5,6,11,12-perylene-tetracarboxylic dianhydride, cyclopentane-1,2,3,4-tetracarboxylic dianhydride, pyrazine-2,3,5,6-tetracarboxylic dianhydride, pyrrolidine-2,3,4,5-tetracarboxylic dianhydride, thiophene-2,3,4,5-tetracarboxylic dianhydride, and 4,4'-bis(2,3-dicarboxyphenoxy) diphenylmethane dianhydride, etc.

The group $R_1$ is a divalent dimer acid-type diamine residue derived from a dimer acid-type diamine. The term "dimer acid-type diamine" refers to a diamine produced by replacing each of two terminal carboxyl groups (—COOH) in a dimer acid with a primary aminomethyl (—CH$_2$—NH$_2$) or amino (—NH$_2$) group.

The dimer acid is a known dibasic acid obtained by intermolecular polymerization of an unsaturated fatty acid, and an industrial production process thereof is virtually standardized in this industry. The dimer acid is obtained by dimerizing an unsaturated fatty acid having 11 to 22 carbons using a clay catalyst or the like. The industrially available dimer acid has, as a main component, a dibasic acid having 36 carbons that is obtained by dimerizing an unsaturated fatty acid having 18 carbons, such as oleic acid or linoleic acid, etc., and contains a monomer acid (carbon number: 18), a trimer acid (carbon number: 54) and other polymeric fatty acids having 20 to 54 carbons, in arbitrary amounts according to the degree of purification. In the first embodiment, a dimer acid in which the dimer acid content is increased to 90 wt % or more by molecular distillation is preferably used. In addition, a double bond remains after the dimerization reaction, and in the first embodiment, a dimer acid in which hydrogenation is further carried out to reduce the degree of unsaturation can also be used.

The dimer acid-type diamine is characterized by being derived from the skeleton of the dimer acid. That is, since the dimer acid-type diamine is aliphatic and macromolecular having a molecular weight of about 560 to 620, the molar volume of the molecules is increased and the polar groups of the polyimide can be relatively decreased. Such dimer acid-type diamine is characterized by improving dielectric characteristics of the polyimide while suppressing reduction in the heat resistance thereof. In addition, since the dimer acid-type diamine has two freely movable hydrophobic chains having 7 to 9 carbons and two chain aliphatic amino groups having a length equivalent to 18 carbons, the polyimide is not only imparted with softness, but also can have an asymmetric or nonplanar chemical structure. Therefore, the dielectric constant of the polyimide can be reduced.

The preparation amount of the dimer acid-type diamine may be 1 to 15 mol %, preferably 4 to 15 mol %, relative to the whole diamine component. If the amount of the dimer acid-type diamine is less than 1 mol %, the dielectric characteristics of the polyimide tend to deteriorate. If the amount exceeds 15 mol %, the heat resistance of the polyimide tends to deteriorate due to lowering of the glass transition temperature.

The dimer acid-type diamine is commercially available, and examples thereof include Priamine 1073 (trade name) and Priamine 1074 (trade name), both made by Croda Japan KK, Versamine 551 (trade name) and Versamine 552 (trade name), both made by Cognis Japan Ltd., and so on.

In addition, the group $R_2$ can be exemplified by the groups represented by formulae (5) to (7) below.

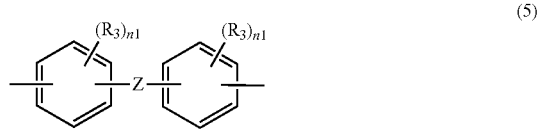

(5)

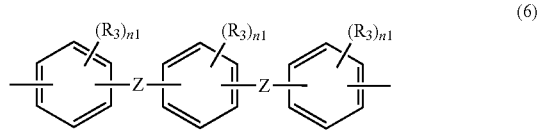

(6)

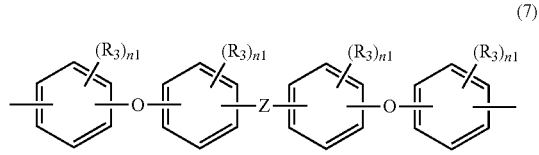

(7)

In formulae (5) to (7), $R_3$ independently represents a monovalent hydrocarbon group or alkoxy having 1 to 6 carbons, Z represents a single bond, a divalent hydrocarbon group having 1 to 15 carbons, or a divalent group selected from —O—, —S—, —CO—, —SO—, —SO$_2$—, —NH— and —CONH—, and $n_1$ independently represents an integer of 0 to 4.

Particularly, from the viewpoint of decreasing polar groups and improving dielectric characteristics of the polyimide, in the formulae (5) to (7) as the group $R_2$, Z is preferably a single bond or a divalent hydrocarbon group having 1 to 15 carbons, $R_3$ is preferably a monovalent hydrocarbon group having 1 to 6 carbons, and $n_1$ is preferably an integer of 0 to 4.

Examples of the diamine having the group $R_2$ as a residue include 4,4'-diaminodiphenyl ether, 2'-methoxy-4,4'-diaminobenzanilide, 1,4-bis(4-aminophenoxy)benzene, 1,3-bis(4-aminophenoxy)benzene, 2,2'-bis[4-(4-aminophenoxy)phenyl]propane, 2,2'-dimethyl-4,4'-diaminobiphenyl, 3,3'-dihydroxy-4,4'-diaminobiphenyl, 4,4'-diaminobenzanilide, 2,2-bis-[4-(3-aminophenoxy)phenyl]propane, bis[4-(4-aminophenoxy)phenyl]sulfone, bis[4-(3-aminophenoxy)phenyl]sulfone, bis[4-(4-aminophenoxy)]biphenyl, bis[4-(3-aminophenoxy)]biphenyl, bis[1-(4-aminophenoxy)] biphenyl, bis[1-(3-aminophenoxy)]biphenyl, bis[4-(4-aminophenoxy)phenyl]methane, bis[4-(3-aminophenoxy) phenyl]methane, bis[4-(4-aminophenoxy)phenyl]ether, bis [4-(3-aminophenoxy)phenyl]ether, bis[4-(4-aminophenoxy)]benzophenone, bis[4-(3-aminophenoxy)] benzophenone, bis[4,4'-(4-aminophenoxy)]benzanilide, bis [4,4'-(3-aminophenoxy)]benzanilide, 9,9-bis[4-(4-aminophenoxy)phenyl]fluorene, 9,9-bis[4-(3-aminophenoxy)phenyl]fluorene, 2,2-bis-[4-(4-aminophenoxy)phenyl]hexafluoropropane, 2,2-bis-[4-(3-aminophenoxy)phenyl]hexafluoropropane, 4,4'-methylenedi-o-toluidine, 4,4'-methylenedi-2,6-xylidine, 4,4'-methylene-2,6-diethylaniline, 4,4'-diaminodiphenylpropane, 3,3'-diaminodiphenylpropane, 4,4'-diaminodiphenylethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenylsulfone, 3,3'-diaminodiphenylsulfone, 4,4'-diaminodiphenyl ether, 3,3-diaminodiphenyl ether, 3,4'-diaminodiphenyl ether, benzidine, 3,3'-diaminobiphenyl, 3,3'-dimethyl-4,4'-diaminobiphenyl, 3,3'-dimethoxybenzidine, 4,4"-diamino-p-terphenyl, 3,3"-diamino-p-terphenyl, m-phenylenediamine, p-phenylenediamine, 2,6-diaminopyridine, 1,4-bis(4-aminophenoxy)benzene, 1,3-bis(4-aminophenoxy)benzene, 4,4'-[1,4-phenylenebis(1-methylethylidene)]bisaniline, 4,4'-[1,3-phenylenebis(1-methylethylidene)]bisaniline, bis(p-aminocyclohexyl) methane, bis(p-β-amino-t-butylphenyl)ether, bis(p-β-methyl-δ-aminopentyl)benzene, p-bis(2-methyl-4-aminopentyl)benzene, p-bis(1,1-dimethyl-5-aminopentyl) benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylenediamine, p-xylylenediamine, 2,6-diaminopyridine, 2,5-diaminopyridine, 2,5-diamino-1,3,4-oxadiazole, and piperazine, etc.

Based on the dielectric characteristics of the polyimide, the aromatic tetracarboxylic anhydride suitably used in preparation of precursors of the polyimide of the first embodiment include, e.g., 3,3',4,4'-biphenyl tetracarboxylic dianhydride (BPDA), 3,3',4,4'-benzophenone tetracarboxylic dianhydride (BTDA), 3,3',4,4'-diphenylsulfonetetracarboxylic dianhydride (DSDA), and pyromellitic dianhydride (PMDA), etc. Among them, particularly preferred examples of the anhydride include 3,3',4,4'-biphenyl tetracarboxylic dianhydride (BPDA) and 3,3',4,4'-benzophenone tetracarboxylic dianhydride (BTDA), etc. These aromatic tetracarboxylic anhydrides can also be blended as a combination of two or more thereof.

In addition, based on the dielectric characteristics of the polyimide, the aromatic diamine suitably used in preparation of precursors of the polyimide of the first embodiment include, e.g., 2,2-bis(4-aminophenoxyphenyl)propane (BAPP), 2,2'-divinyl-4,4'-diaminobiphenyl (VAB), 2,2'-dimethyl-4,4'-diaminobiphenyl (m-TB), 2,2'-diethyl-4,4'-diaminobiphenyl, 2,2',6,6'-tetramethyl-4,4'-diaminobiphenyl, 2,2'-diphenyl-4,4'-diaminobiphenyl, and 9,9-bis(4-aminophenyl)fluorene, etc. Among them, particularly preferred examples of the diamine component include 2,2-bis(4-aminophenoxyphenyl)propane (BAPP), 2,2'-divinyl-4,4'-diaminobiphenyl (VAB) and 2,2'-dimethyl-4,4'-diaminobiphenyl (m-TB), etc. These aromatic diamines can also be blended as a combination of two or more thereof.

The aforementioned anhydrides or diamines may be used alone or in combination of two or more. In addition, other diamines and anhydrides excluded from general formulae (1) and (2) can also be used together with the aforementioned anhydrides or diamines. In this case, the proportion of the other anhydrides or diamines used is preferably 10 mol % or less, more preferably 5 mol % or less. By selecting the species of anhydrides and diamines, or the respective molar proportions when two or more kinds of anhydrides or diamines are used, thermal expansion, adhesiveness and glass transition temperature and so on can be controlled.

The polyimide having the constitutional units represented by general formulae (1) and (2) can be produced by reacting the aforementioned aromatic tetracarboxylic anhydride, dimer acid-type diamine and aromatic diamine in a solvent to produce a precursor resin and then subjecting the same to ring closure under heating. For example, the anhydride component and the diamine component are dissolved in an organic solvent in substantially equal molar amounts, and are stirred at a temperature of 1 to 100° C. for 30 min to 24 hr to perform a polymerization reaction and obtain a polyamic acid being a precursor of the polyimide. In the reaction, the reactants are dissolved so that the amount of the produced precursor in the organic solvent becomes 5 to 30 wt %, preferably 10 to 20 wt %. Examples of the organic solvent used for the polymerization reaction include N,N-dimethylformamide, N,N-dimethylacetamide (DMAC), N-methyl-2-pyrrolidone, 2-butanone, dimethyl sulfoxide, dimethyl sulfate, cyclohexanone, dioxane, tetrahydrofuran, diglyme, and triglyme, etc. These solvents can also be used in combination of two or more. Further, they can also be used in combination with an aromatic hydrocarbon such as xylene or toluene. In addition, the amount of such organic solvent to be used is not particularly limited. However, the amount used is preferably adjusted so that the concentration of the polyamic acid solution (polyimide precursor solution) obtained by the polymerization reaction becomes about 5 to 30 wt %.

A synthesized precursor is usually advantageously used as a reaction solvent solution, but can be condensed, diluted, or replaced with other organic solvents if necessary. In addition, the precursor generally has good solubility in solvents and is thus advantageously used. The method for imidizing the precursor is not particularly limited. For example, a heat treatment of heating the precursor at a temperature of 80 to 400° C. for 1 to 24 hours is suitably adopted.

[Resin Film]

The resin film of the 1$^{st}$ embodiment is not particularly limited as long as it is an insulating resin film containing a polyimide layer formed of the polyimide of the first embodiment, and may be a film (sheet) composed of insulating resin, or may be an insulating resin film laminated on a substrate such as a copper foil, a glass plate, or a resin sheet such as a polyimide-based film, a polyamide-based film or a polyester-based film. In addition, the thickness of the resin film of the first embodiment is preferably 3 to 100 μm, more preferably 3 to 75 μm.

The resin film of the first embodiment preferably has a dielectric constant of 3.0 or less at 10 GHz, in order to ensure the impedance matching when used in a circuit board such as an FPC. If the resin film has a dielectric constant of greater than 3.0 at 10 GHz, when it is used in a circuit board such as FPC, the impedance is likely to change in the transmission path of high-frequency signals so that electromagnetic wave reflection occurs, and inconveniences such as loss of electrical signals or deformation of signal waveform are easily caused.

In addition, the resin film of the first embodiment preferably has a dielectric tangent of 0.005 or less at 10 GHz, in order to ensure the impedance matching when used in a circuit board such as an FPC. If the resin film has a dielectric tangent of greater than 0.005 at 10 GHz, when it is used in a circuit board such as an FPC, the impedance is likely to change in the transmission path of high-frequency signals so that electromagnetic wave reflection occurs, and inconveniences such as loss of electrical signals or deformation of signal waveform are easily caused.

In the polyimide layer formed of the polyimide of the first embodiment, a polyimide layer having low adhesiveness and low thermal expansion is suitably used as a base film layer (main layer of the insulating resin layer). Specifically, as a low thermal expansion polyimide layer having a linear thermal expansion coefficient of $1 \times 10^{-6}$ to $30 \times 10^{-6}$ (1/K), preferably $1 \times 10^{-6}$ to $25 \times 10^{-6}$ (1/K), and more preferably $15 \times 10^{-6}$ to $25 \times 10^{-6}$ (1/K), is used as the base film layer, significant effects can be obtained. On the other hand, a polyimide layer having a linear thermal expansion coefficient greater than the above is suitably used as, e.g., an adhesion layer with a substrate such as a metal layer or other resin layer. The polyimide that can be suitably used as such adhesive polyimide layer has a glass transition temperature of preferably, e.g., 350° C. or lower, more preferably 200 to 320° C.

The polyimide that forms the low thermal expansion polyimide layer is preferably a polyimide having the structural units represented by general formulae (1) and (2). In general formulae (1) and (2), the group Ar represents a tetravalent aromatic group represented by formula (3) or (4), the group $R_1$ represents a divalent dimer acid-type diamine residue derived from a dimer acid-type diamine, the group $R_2$ represents a divalent aromatic group represented by formula (5) or (7), $R_3$ independently represents a monovalent hydrocarbon group or alkoxy having 1 to 6 carbons, W or Z independently represents a single bond, a divalent hydrocarbon group having 1 to 15 carbons, or a divalent group selected from —O—, —S—, —CO—, —SO—, —SO$_2$—, —NH— and —CONH—, and $n_1$ independently represents an integer of 0 to 4. Among the low thermal expansion polyimides having such structural units, the polyimide that can be suitably utilized is a non-thermoplastic polyimide.

In general formulae (1) and (2), the group Ar can be a residue of an anhydride, the group $R_1$ can be a dimer acid-type diamine residue, and the group $R_2$ can be a residue of a diamine. Therefore, preferred non-thermoplastic polyimides are described according to the diamine and the anhydride. However, the polyimide is not limited to those obtained from the diamines and anhydrides described herein.

Examples of the anhydride that can be suitably used for forming the non-thermoplastic polyimide include the anhydrides mentioned in the above descriptions of the polyimide. Among them, particularly preferred examples of the anhydride include one or more selected from pyromellitic dianhydride (PMDA), 3,3',4,4'-biphenyl tetracarboxylic dianhydride (BPDA), 3,3',4,4'-benzophenone tetracarboxylic dianhydride (BTDA) and 3,3',4,4'-diphenylsulfonetetracarboxylic dianhydride (DSDA).

Examples of the aromatic diamine that can be suitably used for forming the non-thermoplastic polyimide include the diamines mentioned in the above descriptions of the polyimide. Among them, in view of heat resistance and dimensional stability, particularly preferred diamines have a phenylene group or a biphenylene group in a molecule, and examples thereof include one or more selected from 2,2'-divinyl-4,4'-diaminobiphenyl (VAB), 2,2'-dimethyl-4,4'-diaminobiphenyl (m-TB), 2,2'-diethyl-4,4'-diaminobiphenyl, 2,2',6,6'-tetramethyl-4,4'-diaminobiphenyl, 2,2'-diphenyl-4,4'-diaminobiphenyl, and 9,9-bis(4-aminophenyl)fluorene.

The polyimide that forms the adhesive polyimide layer is preferably a polyimide having the structural units represented by general formulae (1) and (2). In general formulae (1) and (2), the group Ar represents a tetravalent aromatic group represented by formula (3) or (4), the group $R_2$ represents a divalent aromatic group represented by formula (5), (6) or (7), $R_3$ independently represents a monovalent hydrocarbon group or alkoxy having 1 to 6 carbons, W and Z each independently represent a single bond, a divalent hydrocarbon group having 1 to 15 carbons, or a divalent group selected from —O—, —S—, —CO—, —SO$_2$— or —CONH—, and $n_1$ independently represents an integer of 0 to 4. Among the adhesive polyimides having such structural units, the polyimide that can be suitably utilized is a theinioplastic polyimide.

In general formulae (1) and (2), the group Ar can be a residue of an anhydride, the group $R_1$ can be a dimer acid-type diamine residue, and the group $R_2$ can be a residue of a diamine. Therefore, preferred thermoplastic polyimides are described according to the diamine and the anhydride. However, the polyimide is not limited to those obtained from the diamines and anhydrides described herein.

Examples of the anhydride that can be suitably used for forming the thermoplastic polyimide include pyromellitic dianhydride, 3,3',4,4'-biphenyl tetracarboxylic dianhydride, 3,3',4,4'-diphenylsulfonetetracarboxylic dianhydride and 4,4'-oxydiphthalic anhydride, etc. In addition, the anhydrides mentioned in the above descriptions of the polyimide can also be used. Among them, particularly preferred examples of the anhydride include one or more selected from pyromellitic dianhydride (PMDA), 3,3',4,4'-biphenyl tetracarboxylic dianhydride (BPDA), 3,3',4,4'-benzophenone tetracarboxylic dianhydride (BTDA) and 3,3',4,4'-diphenylsulfonetetracarboxylic dianhydride (DSDA).

In view of heat resistance and adhesiveness, the aromatic diamine that can be suitably used for forming the thermoplastic polyimide preferably has a phenylene group or biphenylene group in a molecule, or has a divalent linking group including oxygen or sulfur in a molecule, and examples thereof include 4,4'-diaminodiphenyl ether, 2'-methoxy-4,4'-diaminobenzanilide, 1,4-bis(4-aminophenoxy)benzene, 1,3-bis(4-aminophenoxy)benzene, 2,2-bis[4-(4-aminophenoxy)phenyl]propane, 2,2'-dimethyl-4,4'-diaminobiphenyl, 3,3'-dihydroxy-4,4'-diaminobiphenyl, and 4,4'-diaminobenzanilide, etc. In addition, the diamines mentioned in the above descriptions of the polyimide can also be used. Among them, particularly preferred examples of the diamine component include one or more selected from 1,3-bis(4-aminophenoxy)-2,2-dimethylpropane (DANPG), 2,2-bis[4-(4-aminophenoxy)phenyl]propane (BAPP), 1,3-bis(3-aminophenoxy)benzene (APB), p-phenylenediamine (p-PDA), 3,4'-diaminodiphenyl ether (DAPE34), and 4,4'-diaminodiphenyl ether (DAPE44).

The method for forming the polyimide film as the resin film of the first embodiment is not particularly limited. For example, a method may be mentioned in which a polyimide solution (or polyamic acid solution) is coated on an arbitrary substrate and then subjected to a heat treatment (drying and curing) so as to form a polyimide layer (or polyamic acid layer) on the substrate, and then peeling is performed to produce the polyimide film. The method for coating the polyimide solution (or polyamic acid solution) on the substrate is not particularly limited, and the coating can be performed by a coater such as a comma, a die, a knife or a lip, etc. During formation of a plurality of polyimide layers, a method in which coating of the polyimide solution (or polyamic acid solution) on the substrate and drying of the same are repeated is preferred.

The resin film of the first embodiment may include one or a plurality of polyimide layers. In this case, at least one of the polyimide layers (preferably the base film layer) may be formed using the non-thermoplastic polyimide of the first embodiment, and it is preferred that all the polyimide layers are formed using the polyimides (non-thermoplastic polyimide and thermoplastic polyimide) of the first embodiment. For example, if a non-thermoplastic polyimide layer is named P1 and a thermoplastic polyimide layer is named P2, when the resin film includes two layers, the lamination is preferably formed by a P2/P1 combination; when the resin film includes three layers, the layers are preferably laminated in the order of P2/P1/P2 or P2/P1/P1. Herein, P1 is the base film layer formed using the non-thermoplastic polyimide of the first embodiment. Moreover, P2 may be composed of a polyimide other than the polyimide of the first embodiment.

The resin film of the first embodiment may contain an inorganic filler in the polyimide layer, if necessary. Specific examples include silicon dioxide, aluminum oxide, magnesium oxide, beryllium oxide, boron nitride, aluminum nitride, silicon nitride, aluminum fluoride, and calcium fluoride, etc. These can be used alone or as a mixture of two or more.

Examples of use of the resin film of the first embodiment as a low thermal expansion polyimide film includes use of the same as a coverlay film material of a coverlay film. The coverlay film can be formed by laminating an arbitrary adhesive layer on the resin film of the first embodiment. The thickness of the coverlay film material layer is not particularly limited, and is preferably, e.g., 5 μm to 100 μm. In addition, the thickness of the adhesive layer is not particularly limited, and is preferably, e.g., 25 μm to 50 μm.

Examples of use of the resin film of the first embodiment as an adhesive polyimide film include use of the same as a bonding sheet of a multi-layered FPC. When used as the bonding sheet, the resin film of the first embodiment may be directly used as the bonding sheet on an arbitrary substrate film, or the resin film may be used while being laminated with an arbitrary substrate film.

[Metal-Clad Laminate]

The metal-clad laminate of the first embodiment includes an insulating resin layer, and a metal layer laminated on at least one side of the insulating resin layer. Specific preferred examples of the metal-clad laminate include a copper-clad laminate (CCL) and so on.

<Insulating Resin Layer>

In the metal-clad laminate of the first embodiment, the insulating resin layer has one or a plurality of polyimide layers. In this case, in order to give good high frequency characteristics to the metal-clad laminate, at least one of the polyimide layers (preferably the base film layer) may be formed using the non-thermoplastic polyimide of the first embodiment, and it is preferred that all the polyimide layers are formed using the polyimides (non-thermoplastic polyimide and thermoplastic polyimide) of the first embodiment. In addition, in order to increase the adhesiveness between the insulating resin layer and the metal layer, a layer in the insulating resin layer that contacts the metal layer is preferably a thermoplastic polyimide layer formed using the polyimide of the first embodiment. For example, when the insulating resin layer includes two layers, if a non-thermoplastic polyimide layer is named P1, a thermoplastic polyimide layer is named P2 and the metal layer is named M1, the layers are preferably laminated in the order of P1/P2/M1. Herein, P1 is the base film layer formed using the non-thermoplastic polyimide of the first embodiment. Moreover, P2 may be composed of a polyimide other than the polyimide of the first embodiment.

In the metal-clad laminate of the first embodiment, the insulating resin layer preferably has a dielectric constant of 3.0 or less at 10 GHz, in order to ensure the impedance matching when used in a circuit board such as an FPC. If the insulating resin layer has a dielectric constant of greater than 3.0 at 10 GHz, when it is used in a circuit board such as an FPC, the impedance is likely to change in the transmission path of high-frequency signals so that electromagnetic wave reflection occurs, and inconveniences such as loss of electrical signals or deformation of signal waveform are easily caused.

In addition, in the metal-clad laminate of the first embodiment, the insulating resin layer preferably has a dielectric tangent of 0.005 or less at 10 GHz, in order to ensure the impedance matching when used in a circuit board such as an FPC. If the insulating resin layer has a dielectric tangent of greater than 0.005 at 10 GHz, when it is used in a circuit board such as an FPC, the impedance is likely to change in the transmission path of high-frequency signals so that electromagnetic wave reflection occurs, and inconveniences such as loss of electrical signals or deformation of signal waveform are easily caused.

<Metal Layer>

The material of the metal layer in the metal-clad laminate of the first embodiment is not particularly limited, and examples thereof include copper, stainless steel, iron, nickel, beryllium, aluminum, zinc, indium, silver, gold, tin, zirconium, tantalum, titanium, lead, magnesium, manganese, and alloys thereof, etc. Among them, copper or copper alloy is particularly preferred. Moreover, the material of the wiring layer in the later-described circuit board of the first embodiment is similar to that of the metal layer.

When a high-frequency signal is supplied to a signal wiring, the current only flows on the surface of the signal wiring, and a problem (skin effect) occurs in which an effective sectional area where the current flows is reduced, so that the DC resistance is increased and the signal is attenuated. By reducing a surface roughness of the surface of the metal layer that contacts the insulating resin layer, the resistance increase of the signal wiring caused by the skin effect can be suppressed. However, if the surface roughness is reduced in order to satisfy electrical performance requirement criteria, adhesive force (peel strength) between copper foil and a dielectric substrate becomes weaker. Hence, from the viewpoint of satisfying electrical performance requirements, and improving visibility of the metal-clad laminate while ensuring the adhesiveness with the insulating resin layer, for the surface roughness of the surface of the metal layer that contacts the insulating resin layer, the ten-point average roughness Rz is preferably 1.5 μm or less, and the arithmetic average roughness Ra is preferably 0.2 μm or less.

The metal-clad laminate may be produced in the following manner. For example, a resin film configured to contain the polyimide of the first embodiment is prepared, to which metal is sputtered to form a seed layer, and then a metal layer is formed by, e.g., plating.

In addition, the metal-clad laminate may also be produced in the following manner. A resin film configured to contain the polyimide of the first embodiment is prepared, on which a metal foil is laminated by thermocompression bonding or other methods.

Further, the metal-clad laminate may also be produced in the following manner. A coating liquid containing a polyamic acid being a precursor of the polyimide of the first embodiment is cast on a metal foil and dried to produce a coating film, which is then subjected to a heat treatment to be imidized so as to form a polyimide layer.

[Circuit Board]

The circuit board of the first embodiment has the insulating resin layer and the wiring layer formed on the insulating resin layer. In the circuit board of the first embodiment, the insulating resin layer may have one or a plurality of polyimide layers. In this case, in order to give good high frequency characteristics to the circuit board, at least one of the polyimide layers (preferably the base film layer) may be formed using the non-thermoplastic polyimide of the first embodiment, and it is preferred that the whole polyimide layers are formed using the polyimides (non-thermoplastic polyimide and thermoplastic polyimide) of the first embodiment. In addition, in order to increase the adhesiveness between the insulating resin layer and the wiring layer, the layer in the insulating resin layer that contacts the wiring layer is preferably a thermoplastic polyimide layer formed using the polyimide of the first embodiment. For example, when the insulating resin layer includes two layers, if a non-thermoplastic polyimide layer is named P1, a thermoplastic polyimide layer is named P2 and the wiring layer is named M2, the layers are preferably laminated in the order of P1/P2/M2. Herein, P1 is the base film layer formed using the non-thermoplastic polyimide of the first embodiment. Moreover, P2 may be composed of a polyimide other than the polyimide of the first embodiment.

In this embodiment, the method for manufacturing the circuit board is not particularly limited as long as the polyimide of the first embodiment is used. For example, a subtractive method may be used in which a metal-clad laminate composed of an insulating resin layer that contains the polyimide of the first embodiment and a metal layer is prepared, and the metal layer is etched to form a wiring. In addition, a semiadditive method may also be used in which a seed layer is formed on the polyimide layer of the first embodiment, then a resist is formed into a pattern, and further, the metal is pattern-plated to form a wiring.

Hereinafter, the method for manufacturing the circuit board of this embodiment is specifically explained by giving a typical example in which a casting method and the subtractive method are used in combination.

First of all, the method for producing the metal-clad laminate of the first embodiment may include the following processes (1) to (3).

Process (1):

Process (1) is a process of obtaining a resin solution of polyamic acid being a precursor of the polyimide of the first embodiment. As described above, this process can be performed by reacting the raw-material diamine component containing the dimer acid-type diamine and the aromatic diamine with the raw-material anhydride component in an appropriate solvent.

Process (2):

Process (2) is a process of coating the resin solution of polyamic acid on a metal foil to be the metal layer so as to form a coating film. The metal foil may have a cut sheet shape, a roll shape, or an endless belt shape, etc. In order to gain productivity, it is efficient that the metal foil has a roll shape or an endless belt shape to allow continuous production. Furthermore, from the viewpoint of further exhibiting an improvement in wiring pattern precision in the circuit board, the copper foil is preferably formed into a long roll shape.

The method for forming the coating film may be direct coating of the resin solution of polyamic acid on the metal foil, or coating of the resin solution on the polyimide layer supported by the metal foil followed by drying. The coating method is not particularly limited, and can be performed by a coater such as a comma, a die, a knife or a lip, etc.

The polyimide layer may include one or a plurality of layers. When the polyimide layer includes a plurality of layers, it can be formed by coating, on a precursor layer including different components, other precursors in sequence. When the precursor layer includes three or more layers, the precursor having the same composition may be used twice or more times. A simple two-layered or single-layer structure is preferred for being achievable in an industrially advantageous manner. In addition, the thickness of the precursor layer (after drying) is, e.g., 3 to 100 µm, preferably 3 to 50 µm.

When the polyimide layer includes a plurality of layers, the base film layer is a non-thermoplastic polyimide layer containing the polyimide of the first embodiment, and the precursor layer is preferably formed so that the polyimide layer that contacts the metal layer is a thermoplastic polyimide layer. By using the thermoplastic polyimide, the adhesiveness with the metal layer can be improved. Such thermoplastic polyimide preferably has a glass transition temperature (Tg) of 360° C. or lower, more preferably 200 to 320° C.

In addition, it is also possible that the single-layered or multi-layered precursor layer is temporarily imidized to form a single-layered or multi-layered polyimide layer, and then a precursor layer is further formed thereon.

Process (3):

Process (3) is a process of subjecting the coating film to a heat treatment to imidize the same, so as to form the insulating resin layer. The imidization method is not particularly limited. For example, a heat treatment of heating the coating film at a temperature of 80 to 400° C. for 1 to 60 min is suitably adopted. In order to suppress oxidation of the metal layer, a heat treatment under a low oxygen atmosphere is preferred. Specifically, the heat treatment is preferably performed under an inert gas atmosphere such as nitrogen or a rare gas, a reducing gas atmosphere such as hydrogen, or in vacuum. Due to the heat treatment, the polyamic acid in the coating film is imidized to form a polyimide.

In this way, the metal-clad laminate including the polyimide layer (single-layered or multi-layered) and the metal layer can be produced.

The method for manufacturing the circuit board of the first embodiment may further include, in addition to the processes (1) to (3), the following process (4).

Process (4):

Process (4) is a process of patterning the metal foil of the metal-clad laminate to form the wiring layer. In this process, the metal layer is formed into a pattern in a predetermined shape by etching and processed into a wiring layer, thereby obtaining the circuit board. The etching may be performed by an arbitrary method that utilizes, e.g., photolithographic techniques.

Moreover, the above only describes the characteristic processes in the method for manufacturing the circuit board. That is, during manufacture of the circuit board, processes other than the aforementioned usual processes, such as through hole processing in a preceding process or terminal plating and outline shaping in subsequent processes can be performed by conventional methods.

As described above, by using the polyimide of the first embodiment, a metal-clad laminate having good impedance matching can be formed. In addition, by using the polyimide of the first embodiment, in a circuit board typified by an FPC, transmission characteristics of electrical signals are improved, and reliability can be enhanced.

Second Embodiment

Recently, in safety aspects, requirements for flame retardancy of materials get higher. Moreover, in environmental aspects represented by the Restriction of Hazardous Substances (RoHS) Directive and the Waste Electrical and Electronic Equipment (WEEE) Directive, it is required to not contain a conventionally used halogen-containing flame retardant and be halogen free. When a flame retardant is blended in the insulating resin layer of the circuit board typified by an FPC, there is a worry that physical properties of the insulating resin layer may vary depending on the flame retardant components. For example, when the thermal expansion coefficient of the insulating resin layer is considerably changed by blending of the flame retardant, dimensional stability of the insulating resin layer is reduced. As a result, a problem that the reliability of electronic devices using the circuit board is reduced may occur.

The second embodiment of the invention relates to a polyimide, a resin film and a metal-clad laminate that can cope with increased frequency associated with size reduction and performance improvement of electronic devices and that have good dimensional stability and flame retardancy.

[Polyimide of Second Embodiment]

The polyimide of the second embodiment is a non-thermoplastic polyimide having low adhesiveness and low thermal expansion and obtained by reacting an anhydride component containing an aromatic tetracarboxylic anhydride with a diamine component containing an aromatic diamine. The polyimide is generally produced by reacting an anhydride with a diamine. Therefore, by describing the anhydride and the diamine, specific examples of the polyimide can be understood. Hereinafter, preferred polyimides are described according to the anhydride and the diamine.

<Anhydride>

As the anhydride component as a raw material of the polyimide of the second embodiment, at least an aromatic tetracarboxylic anhydride (hereinafter sometimes referred to as "anhydride (I)") selected from the group consisting of pyromellitic dianhydride and 1,4,5,8-naphthalenetetracarboxylic dianhydride is used. The anhydride (I) enhances flame retardancy and controls molecular orientation property in the polyimide, thereby suppressing an increase in the linear thermal expansion coefficient (CTE) associated with reduction in the imide group concentration. Therefore, the anhydride (I) not only contributes to an improvement in dielectric characteristics but also achieves a reduction in the CTE. From such viewpoint, the anhydride (I) is used in an amount of 40 mol % or more, preferably 80 mol % or more, and most preferably 100 mol %, relative to the whole anhydride component as the raw material. If the amount of the anhydride (I) relative to the whole anhydride component as the raw material is less than 40 mol %, the molecular orientation property is lowered and CTE reduction becomes difficult. Thus, coexistence of lower CTE and lower dielectric constant gets difficult. In addition, in the second embodiment, from the viewpoint of achieving both flame retardancy and dimensional stability, the anhydride (I), particularly pyromellitic dianhydride, is used in an amount of 40 mol % or more, preferably 80 mol % or more, and most preferably 100 mol %, relative to the whole anhydride component as the raw material.

Preferred examples of the anhydride include, in addition to the anhydride (I), 3,3',4,4'-biphenyl tetracarboxylic dianhydride, 3,3',4,4'-diphenylsulfonetetracarboxylic dianhydride and 4,4'-oxydiphthalic anhydride. In addition, examples of the anhydride include 2,2',3,3'-, 2,3,3',4'- or 3,3',4,4'-benzophenonetetracarboxylic dianhydride, 2,3',3, 4'-biphenyl tetracarboxylic dianhydride, 2,2',3,3'-biphenyl tetracarboxylic dianhydride, 2,3',3,4'-diphenyl ether tetracarboxylic dianhydride, bis(2,3-dicarboxyphenyl)ether dianhydride, 3,3'',4,4''-, 2,3,3'',4''- or 2,2'',3,3''-p-terphenyltetracarboxylic dianhydride, 2,2-bis(2,3- or 3,4-dicarboxyphenyl)propane dianhydride, bis(2,3- or 3,4-dicarboxyphenyl)methane dianhydride, bis(2,3- or 3,4-dicarboxyphenyl)sulfone dianhydride, 1,1-bis(2,3- or 3,4-dicarboxyphenyl)ethane dianhydride, 1,2,7,8-, 1,2,6,7- or 1,2,9,10-phenanthrene-tetracarboxylic dianhydride, 2,3,6,7-anthracenetetracarboxylic dianhydride, 2,2-bis(3,4-dicarboxyphenyl)tetrafluoropropane dianhydride, 2,3,5,6-cyclohexane dianhydride, 2,3,6,7-naphthalene tetracarboxylic dianhydride, 1,2,5,6-naphthalene tetracarboxylic dianhydride, 4,8-dimethyl-1,2,3,5,6,7-hexahydronaphthalene-1,2, 5,6-tetracarboxylic dianhydride, 2,6- or 2,7-dichloronaphthalene-1,4,5,8-tetracarboxylic dianhydride, 2,3,6,7-(or 1,4, 5,8-)tetrachloronaphthalene-1,4,5,8-(or 2,3,6,7-) tetracarboxylic dianhydride, 2,3,8,9-, 3,4,9,10-, 4,5,10,11- or 5,6,11,12-perylene-tetracarboxylic dianhydride, cyclopentane-1,2,3,4-tetracarboxylic dianhydride, pyrazine-2,3,5, 6-tetracarboxylic dianhydride, pyrrolidine-2,3,4,5-tetracarboxylic dianhydride, thiophene-2,3,4,5-tetracarboxylic dianhydride, and 4,4'-bis(2,3-dicarboxyphenoxy) diphenylmethane dianhydride, etc.

<Diamine>

As the diamine component as a raw material of the polyimide of the second embodiment, at least a dimer acid-type diamine (hereinafter sometimes referred to as "diamine (IIa)") produced by replacing each of two terminal carboxyl groups in a dimer acid with a primary aminomethyl or amino group, and an aromatic diamine (hereinafter sometime referred to as "diamine (IIb)") represented by general formula (8) below are used.

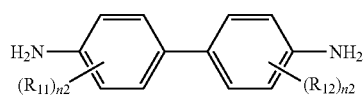

(8)

In the formula, $R_{11}$ and $R_{12}$ independently represent a hydrogen atom, or an alkyl group optionally substituted with a halogen atom or phenyl, at least two of $R_{11}$ and $R_{12}$ represent alkyl groups optionally substituted with a halogen atom or phenyl, and n2 is an integer of 1 to 4.

Diamine (IIa):

The diamine (IIa) is a dimer acid-type diamine, contributing significantly to improvement in dielectric characteristics. As the diamine component as a raw material of the polyimide of the second embodiment, the diamine (IIa) is used in an amount of 1 to 4 mol %. The term "dimer acid-type diamine" herein refers to a diamine produced by replacing each of two terminal carboxyl groups (—COOH) in a dimer acid with a primary aminomethyl (—CH₂—NH₂) or amino (—NH₂) group.

The dimer acid is a known dibasic acid obtained by intermolecular polymerization of an unsaturated fatty acid, and an industrial production process thereof is virtually standardized in this industry. The dimer acid is obtained by dimerizing an unsaturated fatty acid having 11 to 22 carbons using a clay catalyst or the like. The industrially available dimer acid has, as a main component, a dibasic acid having 36 carbons that is obtained by dimerizing an unsaturated fatty acid having 18 carbons, such as oleic acid or linoleic acid, etc., and contains a monomer acid (carbon number: 18), a trimer acid (carbon number: 54) and other polymeric fatty acids having 20 to 54 carbons, in arbitrary amounts according to the degree of purification. In the second embodiment, a dimer acid in which the dimer acid content is increased to 90 wt % or more by molecular distillation is preferably used. In addition, a double bond remains after the dimerization reaction, and in the second embodiment, a dimer acid in which hydrogenation is further carried out to reduce the degree of unsaturation can also be used.

The dimer acid-type diamine is characterized by being derived from the skeleton of the dimer acid. That is, since the dimer acid-type diamine is aliphatic and macromolecular having a molecular weight of about 560 to 620, the molar volume of the molecules is increased and the polar groups of the polyimide can be relatively decreased. Such dimer acid-type diamine is characterized by improving dielectric characteristics of the polyimide while suppressing reduction in heat resistance thereof. In addition, since the dimer acid-type diamine has two freely movable hydrophobic chains having 7 to 9 carbons and two chain aliphatic amino groups having a length equivalent to 18 carbons, the polyimide is not only imparted with softness, but also can have an asymmetric or nonplanar chemical structure. Therefore, the dielectric constant of the polyimide can be reduced.

The preparation amount of the diamine (IIa) may be 1 to 4 mol %, preferably 1.5 to 3.5 mol %, relative to the whole diamine component as the raw material. If the amount of the dimer acid-type diamine is less than 1 mol %, the effect of improving the dielectric characteristics of the polyimide cannot be obtained. If the amount exceeds 4 mol %, the heat resistance and flame retardancy of the polyimide tend to be reduced.

The dimer acid-type diamine is commercially available, and examples thereof include Priamine 1073 (trade name) and Priamine 1074 (trade name), both made by Croda Japan KK, Versamine 551 (trade name) and Versamine 552 (trade name), both made by Cognis Japan Ltd., and so on.

Diamine (IIb):

The diamine (IIb) is an aromatic diamine, controlling the imide group concentration in the polyimide, so as to enhance the flame retardancy and reduce the CTE or improve the dielectric characteristics. From such viewpoint, the diamine (IIb) is used in an amount of 40 to 99 mol %, preferably 40 to 80 mol %, relative to the whole diamine component as the raw material. If the preparation amount of the diamine (Iib) relative to the whole diamine component as the raw material is less than 40 mol %, the molecular orientation property is lowered and CTE reduction becomes difficult. In addition, if the preparation amount of the diamine (IIb) relative to the whole diamine component as the raw material exceeds 99 mol %, relatively, the blending proportion of the diamine (IIa) becomes too low, and thus the effect of improving the dielectric characteristics of the polyimide cannot be sufficiently obtained.

Specific examples of the diamine (IIb) include 2,3'-dimethyl-4,4'-diaminodiphenyl, 3,3',5-trimethyl-4,4'-diaminodiphenyl, 2,2',5,5'-tetramethyl-4,4'-diaminodiphenyl, 3,3',5,5'-tetramethyl-4,4'-diaminodiphenyl, 2,3',5,5'-tetramethyl-4,4'-diaminodiphenyl, 2,2',3,5-tetramethyl-4,4'-diaminodiphenyl, 2,2',3,3',5,5'-hexamethyl-4,4'-diaminodiphenyl, 2,2',3,3',5,5',6,6'-octamethyl-4,4'-diaminodiphenyl, 2,5-dimethylmethyl-4,4'-diaminodiphenyl, 2,3,5,6-tetramethyl-4,4'-diaminodiphenyl, 2,2'-diethyl-4,4'-diaminodiphenyl, 2,2'-propyl-4,4'-diaminodiphenyl, 2,2'-bis(1-methylethyl)-4,4'-diaminodiphenyl, 5,5'dimethyl-2,2'-bis(1-methylethyl)-4,4'-diaminodiphenyl, 2,2'-dioctyl-4,4'-diaminodiphenyl, 2,2'-bis(phenylmethyl)-4,4'-diaminodiphenyl, and 4,4'-diamino-2,2'-bis(trifluoromethyl) biphenyl, etc.

Among the diamines (IIb), those with $R_{11}$ and $R_{12}$ in general formula (8) being alkyl groups having 1 to 3 carbons are preferred, and 4,4'-diamino-2,2'-dimethyldiphenyl and 4,4'-diamino-3,3'-dimethyldiphenyl are more preferred.

Examples of the diamine other than the diamine (IIa) and diamine (IIb) include 4,4'-diaminodiphenyl ether, 2'-methoxy-4,4'-diaminobenzanilide, 1,4-bis(4-aminophenoxy)benzene, 1,3-bis(4-aminophenoxy)benzene, 2,2'-bis[4-(4-aminophenoxy)phenyl]propane, 2,2'-dimethyl-4,4'-diaminobiphenyl, 3,3'-dihydroxy-4,4'-diaminobiphenyl, 4,4'-diaminobenzanilide, 2,2-bis-[4-(3-aminophenoxy)phenyl] propane, bis[4-(4-aminophenoxy)phenyl]sulfone, bis[4-(3-aminophenoxy)phenyl]sulfone, bis[4-(4-aminophenoxy)] biphenyl, bis[4-(3-aminophenoxy)]biphenyl, bis[1-(4-aminophenoxy)]biphenyl, bis[1-(3-aminophenoxy)] biphenyl, bis[4-(4-aminophenoxy)phenyl]methane, bis[4-(3-aminophenoxy)phenyl]methane, bis[4-(4-aminophenoxy)phenyl]ether, bis[4-(3-aminophenoxy) phenyl]ether, bis[4-(4-aminophenoxy)]benzophenone, bis[4-(3-aminophenoxy)]benzophenone, bis[4,4'-(4-aminophenoxy)]benzanilide, bis[4,4'-(3-aminophenoxy)] benzanilide, 9,9-bis[4-(4-aminophenoxy)phenyl]fluorene, 9,9-bis[4-(3-aminophenoxy)phenyl]fluorene, 2,2-bis-[4-(4-aminophenoxy)phenyl]hexafluoropropane, 2,2-bis-[4-(3-aminophenoxy)phenyl]hexafluoropropane, 4,4'-methylenedi-o-toluidine, 4,4'-methylenedi-2,6-xylidine, 4,4'-methylene-2,6-diethylaniline, 4,4'-diaminodiphenylpropane, 3,3'-diaminodiphenylpropane, 4,4'-diaminodiphenyl ethane, 3,3'-diaminodiphenylethane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenylsulfone, 3,3'-diaminodiphenylsulfone, 4,4'-diaminodiphenyl ether, 3,3-diaminodiphenyl ether, 3,4'-diaminodiphenyl ether, benzidine, 3,3'-diaminobiphenyl, 3,3'-dimethoxybenzidine, 4,4"-diamino-p-terphenyl, 3,3"'-diamino-p-terphenyl, m-phenylenediamine, p-phenylenediamine, 2,6-diaminopyridine, 1,4-bis(4-aminophenoxy)benzene, 1,3-bis(4-aminophenoxy)benzene, 4,4'-[1,4-phenylenebis(1-methylethylidene)]bisaniline, 4,4'-[1,3-phenylenebis(1-methylethylidene)]bisaniline, bis(p-aminocyclohexyl)methane, bis(p-β-amino-t-butylphenyl) ether, bis(p-β-methyl-δ-aminopentyl)benzene, p-bis(2-methyl-4-aminopentyl)benzene, p-bis(1,1-dimethyl-5-aminopentyl)benzene, 1,5-diaminonaphthalene, 2,6-diaminonaphthalene, 2,4-bis(β-amino-t-butyl)toluene, 2,4-diaminotoluene, m-xylene-2,5-diamine, p-xylene-2,5-diamine, m-xylylenediamine, p-xylylenediamine, 2,6-diaminopyridine, 2,5-diaminopyridine, 2,5-diamino-1,3,4-oxadiazole, and piperazine, etc.

The aforementioned anhydrides or diamines may be used alone or in combination of two or more. In addition, the aforementioned anhydrides or diamines may be used together with the other diamines and anhydrides. By selecting the types of anhydrides and diamines, or the respective molar proportions when two or more kinds of anhydrides or diamines are used, thermal expansion, adhesiveness and glass transition temperature and so on can be controlled.

The imide group concentration in the polyimide of the $2^{nd}$ embodiment is preferably 33% or less, more preferably 32% or less. The term "imide group concentration" herein refers to a value obtained by dividing the molecular weight of the imide group (—(CO)$_2$—N—) in the polyimide by the molecular weight of the entire polyimide structure. If the imide group concentration exceeds 33%, the flame retardancy of the polyimide is reduced, and the dielectric characteristics deteriorate due to an increase of polar groups. For the polyimide of the second embodiment, the dielectric characteristics are improved by the diamine (IIa), and the molecular orientation property in the polyimide is controlled by selecting the combination of the anhydride (I) and the diamine (IIb). Therefore, an increase in the CTE associated with reduction in the imide group concentration is suppressed, and low dielectric characteristics and low flame retardancy are both achieved.

The polyimide of the second embodiment can be produced by reacting an anhydride component containing the anhydride (I) with a diamine component containing the diamine (IIa) and diamine (IIb) in a solvent to produce a precursor resin and then subjecting the same to ring closure under heating. For example, the anhydride component and the diamine component are dissolved in an organic solvent in substantially equal molar amounts, and are stirred at a temperature of 1 to 100° C. for 30 min to 24 hours to perform a polymerization reaction and obtain a polyamic acid being a precursor of the polyimide. In the reaction, the reactants are dissolved so that the amount of the produced precursor in the organic solvent becomes 5 to 30 wt %, preferably 10 to 20 wt %. Examples of the organic solvent used for the polymerization reaction include N,N-dimethylformamide, N,N-dimethylacetamide (DMAC), N-methyl-2-pyrrolidone, 2-butanone, dimethyl sulfoxide, dimethyl sulfate, cyclohexanone, dioxane, tetrahydrofuran, diglyme, and triglyme, etc. These solvents can also be used in combination of two or more. Further, they can also be used in combination with aromatic hydrocarbons such as xylene or toluene. In addition, the amount of such organic solvent to be used is not particularly limited. However, the amount used is preferably adjusted so that the concentration of a polyamic acid solution (polyimide precursor solution) obtained by the polymerization reaction becomes about 5 to 30 wt %.

A synthesized precursor is usually advantageously used as a reaction solvent solution, but can be condensed, diluted, or replaced with other organic solvent if necessary. In addition, the precursor generally has good solubility in solvents and is thus advantageously used. The method for imidizing the precursor is not particularly limited. For example, a heat treatment of heating the precursor at a temperature of 80 to 400° C. for 1 to 24 hours is suitably adopted.

[Resin Film]

The resin film of the second embodiment is not particularly limited as long as it is an insulating resin film containing a polyimide layer formed of the polyimide of the second embodiment, and may be a film (sheet) composed of insulating resin, or may be an insulating resin film laminated on a substrate such as a copper foil, a glass plate, or a resin sheet such as a polyimide-based film, a polyamide-based film or a polyester-based film. The thickness of the resin film of the second embodiment is preferably 3 to 100 μm, more preferably 3 to 75 μm.

The resin film of the second embodiment preferably has a dielectric constant of 3.3 or less at 3 GHz, in order to ensure the impedance matching when used in a circuit board such as an FPC. If the resin film has a dielectric constant of greater than 3.3 at 3 GHz, when it is used in a circuit board such as an FPC, the impedance is likely to change in the transmission path of high-frequency signals so that electromagnetic wave reflection occurs, and inconveniences such as loss of electrical signals or deformation of signal waveform are easily caused.

In addition, the resin film of the second embodiment preferably has a dielectric tangent of 0.005 or less, more preferably 0.004 or less, at 3 GHz, in order to ensure the impedance matching when used in a circuit board such as an FPC. If the resin film has a dielectric tangent of greater than 0.005 at 3 GHz, when it is used in a circuit board such as an FPC, the impedance is likely to change in the transmission path of high-frequency signals so that electromagnetic wave reflection occurs, and inconveniences such as loss of electrical signals or deformation of signal waveform are easily caused.

The polyimide of the second embodiment has low adhesiveness and low thermal expansion, and is therefore suitably used as the base film layer (main layer of the insulating resin layer) in the resin film. Specifically, the polyimide of the second embodiment has a linear thermal expansion coefficient of $1\times10^{-6}$ to $30\times10^{-6}$ (1/K), preferably $1\times10^{-6}$ to $25\times10^{-6}$ (1/K), and more preferably $15\times10^{-6}$ to $25\times10^{-6}$ (1/K). Accordingly, as the polyimide of the second embodiment is used as a base film layer, good dimensional stability can be obtained.

On the other hand, the resin film of the second embodiment may contain a polyimide layer having a linear thermal expansion coefficient greater than the above. Such polyimide layer is suitably used as, e.g., an adhesion layer with a substrate such as a metal layer or other resin layers. The thermoplastic polyimide that can be suitably used as such adhesive polyimide layer has a glass transition temperature of preferably, e.g., 330° C. or lower, more preferably 200 to 320° C.

Examples of the anhydride that can be suitably used for forming the thermoplastic polyimide include pyromellitic dianhydride, 3,3',4,4'-biphenyl tetracarboxylic dianhydride, 3,3',4,4'-diphenylsulfonetetracarboxylic dianhydride and 4,4'-oxydiphthalic anhydride, etc. In addition, the anhydrides mentioned in the above descriptions of the polyimide of the second embodiment can also be used. Among them, particularly preferred examples of the anhydride include one or more selected from pyromellitic dianhydride (PMDA), 3,3',4,4'-biphenyl tetracarboxylic dianhydride (BPDA), 3,3', 4,4'-benzophenone tetracarboxylic dianhydride (BTDA) and 3,3',4,4'-diphenylsulfonetetracarboxylic dianhydride (DSDA).

In view of heat resistance and adhesiveness, the aromatic diamine that can be suitably used for forming the thermoplastic polyimide preferably has a phenylene group or biphenylene group in a molecule, or has a divalent linking group including oxygen or sulfur in a molecule. Examples thereof include 4,4'-diaminodiphenyl ether, 2'-methoxy-4,4'-diaminobenzanilide, 1,4-bis(4-aminophenoxy)benzene, 1,3-bis(4-aminophenoxy)benzene, 2,2-bis[4-(4-aminophenoxy)phenyl]propane, 2,2'-dimethyl-4,4'-diaminobiphenyl, 3,3'-dihydroxy-4,4'-diaminobiphenyl, and 4,4'-diaminobenzanilide, etc. In addition, the diamines mentioned in the above descriptions of the polyimide of the second embodiment can also be used. Among them, particularly preferred examples of the diamine component include one or more selected from 1,3-bis(4-aminophenoxy)-2,2-dimethylpropane (DANPG), 2,2-bis[4-(4-aminophenoxy)phenyl]propane (BAPP), 1,3-bis(3-aminophenoxy)benzene (APB), p-phenylenediamine (p-PDA), 3,4'-diaminodiphenyl ether (DAPE34), and 4,4'-diaminodiphenyl ether (DAPE44).

The resin film of the second embodiment may include one or a plurality of polyimide layers. In this case, in order to provide good high frequency characteristics, flame retardancy and dimensional stability, at least one of the polyimide layers may be formed using the non-thermoplastic polyimide of the second embodiment. For example, if a non-thermoplastic polyimide layer formed of the polyimide of the second embodiment is named P1 and a layer of thermoplastic polyimide other than the polyimide of the second embodiment is named P2, when the resin film includes two layers, the lamination is preferably formed in a P2/P1 combination. When the resin film includes three layers, the layers are preferably laminated in the order of P2/P1/P2 or P2/P1/P1.

The method for forming the polyimide film as the resin film of the $2^{nd}$ embodiment is not particularly limited. An example thereof is a method in which a polyimide solution (or polyamic acid solution) is coated on an arbitrary substrate and then subjected to a heat treatment (drying and curing) to form a polyimide layer (or polyamic acid layer) on the substrate, and then peeling is performed to produce the polyimide film. The method for coating the polyimide solution (or polyamic acid solution) on the substrate is not particularly limited, and the coating can be performed by a coater such as a comma, a die, a knife or a lip, etc. During formation of a plurality of polyimide layers, a method in which coating of the polyimide solution (or polyamic acid solution) on the substrate and drying of the same are repeated is preferred.

The resin film of the $2^{nd}$ embodiment may contain an inorganic filler in the polyimide layer if necessary. Specific examples include silicon dioxide, aluminum oxide, magnesium oxide, beryllium oxide, boron nitride, aluminum nitride, silicon nitride, aluminum fluoride, and calcium fluoride, etc. These can be used alone or as a mixture of two or more thereof.

Examples of use of the resin film of the second embodiment as a low thermal expansion polyimide film include use of the same as a coverlay film material of a coverlay film. The coverlay film can be formed by laminating an arbitrary adhesive layer on the resin film of the second embodiment. The thickness of the coverlay film material layer is not particularly limited, and is preferably, e.g., 5 μm to 100 μm. In addition, the thickness of the adhesive layer is not particularly limited, and is preferably, e.g., 25 μm to 50 μm.

Examples of use of the resin film of the second embodiment as an adhesive polyimide film include use of the same as a bonding sheet of a multi-layered FPC. When used as a bonding sheet, the resin film of the second embodiment may be directly used as the bonding sheet on an arbitrary substrate film, or the resin film may be used while being laminated with an arbitrary substrate film.

[Metal-Clad Laminate]

The metal-clad laminate of the second embodiment includes an insulating resin layer, and a metal layer laminated on at least one side of the insulating resin layer. Specific preferred examples of the metal-clad laminate include a copper-clad laminate (CCL) and so on.

<Insulating Resin Layer>

In the metal-clad laminate of the second embodiment, the insulating resin layer has one or a plurality of polyimide layers. In this case, for providing good high frequency characteristics, flame retardancy and dimensional stability, at least one of the polyimide layers may be formed using the non-thermoplastic polyimide of the second embodiment. In addition, for increasing the adhesiveness between the insulating resin layer and the metal layer, a layer in the insulating resin layer that contacts the metal layer is preferably a thermoplastic polyimide layer formed using polyimides other than the polyimide of the second embodiment. For example, when the insulating resin layer includes two layers, if a non-thermoplastic polyimide layer formed of the polyimide of the second embodiment is named P1, a layer of a thermoplastic polyimide other than the polyimide of the second embodiment is named P2 and the metal layer is named M1, the layers are preferably laminated in the order of P1/P2/M1.

In the metal-clad laminate of the second embodiment, the insulating resin layer preferably has a dielectric constant of 3.3 or less at 3 GHz, in order to ensure the impedance matching when used in a circuit board such as an FPC. If the insulating resin layer has a dielectric constant of greater than 3.3 at 3 GHz, when it is used in a circuit board such as an FPC, the impedance is likely to change in the transmission path of high-frequency signals so that electromagnetic wave reflection occurs, and inconveniences such as loss of electrical signals or deformation of signal waveform are easily caused.

In addition, in the metal-clad laminate of the second embodiment, the insulating resin layer preferably has a dielectric tangent of 0.005 or less, more preferably 0.004 or less, at 3 GHz, in order to ensure the impedance matching when used in a circuit board such as an FPC. If the insulating resin layer has a dielectric tangent of greater than 0.005 at 3 GHz, when it is used in a circuit board such as an FPC, the impedance is likely to change in the transmission path of high-frequency signals so that electromagnetic wave reflection occurs, and inconveniences such as loss of electrical signals or deformation of signal waveform are easily caused.

<Metal Layer>

The material of the metal layer in the metal-clad laminate of the second embodiment is not particularly limited, and examples thereof include copper, stainless steel, iron, nickel, beryllium, aluminum, zinc, indium, silver, gold, tin, zirconium, tantalum, titanium, lead, magnesium, manganese, and alloys thereof, etc. Among them, copper and copper alloys are particularly preferred. Moreover, the material of the wiring layer in the later-described circuit board of the second embodiment is similar to that of the metal layer.

When a high-frequency signal is supplied to a signal wiring, the current only flows in a surface of the signal wiring, and a problem (skin effect) occurs in which the effective sectional area where the current flows is reduced so that the DC resistance is increased and the signal is attenuated. By reducing the surface roughness of a surface of the metal layer that contacts the insulating resin layer, the resistance increase of the signal wiring caused by the skin effect can be suppressed. However, if the surface roughness is reduced to satisfy electrical performance requirement criteria, adhesive force (peel strength) between copper foil and a dielectric substrate becomes weaker. Hence, from the viewpoint of satisfying electrical performance requirements, and improving visibility of the metal-clad laminate while ensuring the adhesiveness with the insulating resin layer, for the surface roughness of the surface of the metal layer that contacts the insulating resin layer, the ten-point average roughness Rz is preferably 1.5 μm or less, and the arithmetic average roughness Ra is preferably 0.2 μm or less.

The metal-clad laminate of the second embodiment may be produced in the following manner. For example, a resin film configured to contain the polyimide of the second embodiment is prepared, to which metal is sputtered to font a seed layer, and then a metal layer is formed by, e.g., plating.

In addition, the metal-clad laminate of the second embodiment may also be produced in the following manner. A resin film configured to contain the polyimide of the second embodiment is prepared, on which a metal foil is laminated by thermocompression bonding or other method.

Further, the metal-clad laminate of the second embodiment may also be produced in the following manner. A coating liquid containing a polyamic acid being a precursor of the polyimide of the second embodiment is cast on a metal foil and dried to produce a coating film, which is then subjected to a heat treatment to be imidized to form a polyimide layer.

[Circuit Board]

The circuit board of the second embodiment has the insulating resin layer and the wiring layer formed on the insulating resin layer. In the circuit board of the second embodiment, the insulating resin layer may have one or a plurality of polyimide layers. In this case, in order to give good high frequency characteristics to the circuit board, at least one of the polyimide layers may be formed using the non-thermoplastic polyimide of the second embodiment. In addition, in order to increase the adhesiveness between the insulating resin layer and the wiring layer, a layer in the insulating resin layer that contacts the wiring layer is preferably a thermoplastic polyimide layer formed using a polyimide other than the polyimide of the second embodiment. For example, when the insulating resin layer includes two layers, if a non-thermoplastic polyimide layer formed of the polyimide of the second embodiment is named P1, a layer of a thermoplastic polyimide other than the polyimide of the second embodiment is named P2 and the wiring layer is named M2, the layers are preferably laminated in the order of P1/P2/M2.

In this embodiment, the method for manufacturing the circuit board is not particularly limited as long as the polyimide of the second embodiment is used. For example, a subtractive method may be used in which a metal-clad laminate composed of an insulating resin layer that contains the polyimide of the second embodiment and a metal layer is prepared, and the metal layer is etched to form a wiring. In addition, a semiadditive method may also be used in which a seed layer is formed on the polyimide layer of the second embodiment, then a resist is formed into a pattern, and further, the metal is pattern-plated to form a wiring.

Hereinafter, the method for manufacturing the circuit board of this embodiment is specifically explained by giving a typical example in which a casting method and the subtractive method are used in combination.

First of all, the method for producing the metal-clad laminate of the second embodiment may include the following processes (1) to (3).

Process (1):

Process (1) is a process of obtaining a resin solution of polyamic acid being a precursor of the polyimide of the second embodiment. As described above, this process can be performed by reacting the raw-material diamine component containing the dimer acid-type diamine and the aromatic diamine with the raw-material anhydride component in an appropriate solvent.

Process (2):

Process (2) is a process of coating the resin solution of polyamic acid on a metal foil to be the metal layer so as to form a coating film. The metal foil may have a cut sheet shape, a roll shape, or an endless belt shape, etc. In order to gain productivity, it is efficient that the metal foil has a roll shape or an endless belt shape to allow continuous production. Furthermore, from the viewpoint of further exhibiting improvement in wiring pattern precision in the circuit board, the copper foil is preferably formed into a long roll shape.

The method for forming the coating film may be direct coating of the resin solution of polyamic acid on the metal foil, or coating of the resin solution on the polyimide layer supported by the metal foil followed by drying. The coating method is not particularly limited, and can be performed by a coater such as a comma, a die, a knife or a lip, etc.

The polyimide layer may include one or a plurality of layers. When the polyimide layer includes a plurality of layers, it can be formed by coating, on a precursor layer including different components, other precursors in sequence. When the precursor layer includes three or more layers, the precursor having the same composition may be used twice or more times. A simple two-layered or single-layer structure is preferred for being achievable in an industrially advantageous manner. In addition, the thickness of the precursor layer (after drying) is, e.g., 3 to 100 μm, preferably 3 to 50 μm.

When the polyimide layer includes a plurality of layers, the base film layer is a non-thermoplastic polyimide layer containing the polyimide of the second embodiment, and the precursor layer is preferably formed so that the polyimide layer that contacts the metal layer is a thermoplastic polyimide layer. By using the thermoplastic polyimide, the adhesiveness with the metal layer can be improved. Such thermoplastic polyimide preferably has a glass transition temperature (Tg) of 330° C. or lower, more preferably 200 to 320° C.

In addition, it is also possible that the single-layered or multi-layered precursor layer is temporarily imidized to form a single-layered or multi-layered polyimide layer, and then a precursor layer is further formed thereon.

Process (3):

Process (3) is a process of subjecting the coating film to a heat treatment to imidize the same and form the insulating resin layer. The imidization method is not particularly limited. For example, a heat treatment of heating the coating film at a temperature of 80 to 400° C. for 1 to 60 min is suitably adopted. In order to suppress oxidation of the metal layer, a heat treatment under a low oxygen atmosphere is preferred. Specifically, the heat treatment is preferably performed under an inert gas atmosphere such as nitrogen or a rare gas, a reducing gas atmosphere such as hydrogen, or in vacuum. Due to the heat treatment, the polyamic acid in the coating film is imidized to form a polyimide.

In this way, the metal-clad laminate including the polyimide layer (single-layered or multi-layered) and the metal layer can be produced.

The method for manufacturing the circuit board of the second embodiment may further include, in addition to the processes (1) to (3), the following process (4).

Process (4):

Process (4) is a process of patterning the metal foil of the metal-clad laminate to form the wiring layer. In this process, the metal layer is formed into a pattern in a predetermined shape by etching and processed into a wiring layer, thereby obtaining the circuit board. The etching may be performed by an arbitrary method that utilizes, e.g., photolithographic techniques.

Moreover, the above only describes the characteristic processes in the method for manufacturing the circuit board. That is, during manufacture of the circuit board, processes other than the aforementioned usual processes, such as through hole processing in a preceding process or terminal plating and outline shaping in subsequent processes can be performed by conventional methods.

As described above, by using the polyimide of the second embodiment, a metal-clad laminate having good impedance matching and flame retardancy can be formed. In addition, by using the polyimide of the second embodiment, in a circuit board represented by an FPC, reliability can be enhanced due to an improvement in transmission characteristics of electrical signals, and safety can be enhanced due to the impartment of flame retardancy.

EXAMPLES

The features of the invention are more specifically explained with reference to the examples shown below. However, the scope of the invention is not limited to these examples. Moreover, in the following examples, unless specified otherwise, various measurements and evaluations are carried out in the following manners.

[Measurement of Thermal Expansion Coefficient (CTE)]

The thermal expansion coefficient was measured in the following manner. By means of a thermo-mechanical analyzer (made by Bruker Corporation; trade name: 4000 SA), a polyimide film having a size of 3 mm×20 mm was heated from 30° C. to 250° C. at a constant temperature rising rate with application of a load of 5.0 g, further held at that temperature for 10 minutes, and then cooled at a rate of 5° C./min. An average thermal expansion coefficient (linear thermal expansion coefficient) from 240° C. to 100° C. was calculated.

[Measurement of Glass Transition Temperature (Tg)]

The glass transition temperature was measured in the following manner. By means of a viscoelasticity measurement apparatus (DMA) (made by TA Instruments; trade name: RSA 3), a polyimide film having a size of 5 mm×20 mm was heated from 30° C. to 400° C. at a temperature rising rate of 4° C./min at a frequency of 1 Hz. The temperature at which the change in elastic modulus became maximum (the rate of change in tan δ was the largest) was evaluated as Tg.

[Measurement of Peel Strength]

The peel strength was measured in the following manner. By means of a Tensilon tester (made by Toyo Seiki Seisakusho Ltd.; trade name: Strograph VE-10), a sample (laminate composed of a substrate and a resin layer) having a width of 1 mm has the resin layer side fixed to an aluminum plate with double-sided tape, and the force for peeling the substrate from the resin layer in a 180° direction at a rate of 50 mm/min was calculated.

[Measurement of Dielectric Constant and Dielectric Tangent]

The dielectric constant and the dielectric tangent were calculated by method 1 (cavity resonator perturbation method) or method 2 (parallel plate method) below.

Method 1): The dielectric constant and dielectric tangent of a resin sheet (resin sheet after curing) at a specific frequency were measured using a dielectric constant evaluation apparatus (made by Agilent Technologies; trade name: Vector Network Analyzer E8363B) that employs a cavity resonator perturbation method. Moreover, the resin sheet used for the measurement had been left to stand at a temperature of 24 to 26° C. and a humidity of 45 to 50% for 24 hours.

Method 2): The dielectric constant and dielectric tangent of a resin sheet (resin sheet after curing) at a specific frequency were measured using a dielectric constant evaluation apparatus (made by Agilent Technologies; trade name: Material Analyzer E4991A) that employs a parallel plate method. Moreover, the resin sheet used for the measurement had been left to stand at a temperature of 30 to 85° C. and a humidity of 30 to 85% for 1 hour.

[Evaluation of Visibility]

The evaluation of visibility was carried out by measuring total light transmittance and haze. The measurement of the total light transmittance and haze was carried out with respect to a polyimide film having a size of 5 cm×5 cm by a measurement method described in JIS K7136 using a haze measurement apparatus (turbidimeter) (made by Nippon Denshoku Industries Co., Ltd.; trade name: NDH 5000).

The abbreviations used in Examples and Comparative Examples indicate the following compounds.

DDA: dimer acid-type diamine (made by Croda Japan KK; trade name: Priamine 1074; carbon number: 36; amine value: 205 mgKOH/g; content of dimer component: 95 wt % or more)
m-TB: 2,2'-dimethyl-4,4'-diaminobiphenyl
BAPP: 2,2-bis(4-aminophenoxyphenyl)propane
TPE-R: 1,3-bis(4-aminophenoxy)benzene
Wondamine: 4,4'-diaminodicyclohexylmethane
BAFL: 9,9-bis(4-aminophenyl)fluorene
TFMB: 2,2'-bis(trifluoromethyl)-4,4'-diaminobiphenyl
PMDA: pyromellitic dianhydride
BPDA: 3,3',4,4'-biphenyl tetracarboxylic dianhydride
DMAc: N,N-dimethylacetamide Synthesis Example A-1

Under a nitrogen gas stream, 2.196 g of DDA (0.0041 mol), 16.367 g of m-TB (0.0771 mol) and 212.5 g of DMAc were put into a 300 ml separable flask, and dissolved by stirring at room temperature. Next, 4.776 g of BPDA (0.0162 mol) and 14.161 g of PMDA (0.0649 mol) were added, and then the mixture was continuously stirred at room temperature for 3 hours to perform a polymerization reaction, and a polyamic acid solution A-a was obtained. The polyamic acid solution A-a had a solution viscosity of 26,000 cps.

Synthesis Examples A-2 to A-13

Polyamic acid solutions A-b to A-m were prepared in the same way as Synthesis Example A-1 except that the raw material compositions shown in Tables 1 and 2 were employed.

TABLE 1

| Synthesis Example | Polyamic acid solution (cps) | Anhydride component Tetracarboxylic acid (mol) | Diamine component Aliphatic diamine (mol) | Diamine component Aromatic diamine (mol) | Solvent DMAc [g] (solid content; wt %) |
|---|---|---|---|---|---|
| A-1 | A-a (26,000) | BPDA (0.0130) PMDA (0.0519) | DDA (0.003) | m-TB (0.0617) | 212.5 (15) |
| A-2 | A-b (36,600) | BPDA (0.0125) PMDA (0.0502) | DDA (0.006) | m-TB (0.0564) | 212.5 (15) |
| A-3 | A-c (1,400) | BPDA (0.0110) PMDA (0.0441) | DDA (0.0165) | m-TB (0.0386) | 212.5 (15) |
| A-4 | A-d (57,300) | BPDA (0.0132) PMDA (0.0529) | | m-TB (0.0595) TPE-R (0.007) | 212.5 (15) |
| A-5 | A-e (15,000) | BPDA (0.0135) PMDA (0.0539) | Wondamine (0.007) | m-TB (0.0606) | 212.5 (15) |
| A-6 | A-f (46,000) | BPDA (0.0131) PMDA (0.0523) | | BAFL (0.0065) m-TB (0.0588) | 212.5 (15) |

TABLE 2

| Synthesis Example | Polyamic acid solution (cps) | Anhydride component Tetracarboxylic acid (mol) | Diamine component Aliphatic diamine (mol) | Diamine component Aromatic diamine (mol) | Solvent DMAc [g] (solid content; wt %) |
|---|---|---|---|---|---|
| A-7 | A-g (15,000) | BPDA (0.0132) PMDA (0.0526) | | TFMB (0.0066) m-TB (0.0592) | 212.5 (15) |
| A-8 | A-h (5,800) | BPDA (0.0023) PMDA (0.0442) | DDA (0.0047) | BAPP (0.0418) | 212.5 (15) |
| A-9 | A-i (480) | BPDA (0.0022) PMDA (0.0424) | DDA (0.0134) | BAPP (0.0313) | 212.5 (15) |
| A-10 | A-j (2,000) | BPDA (0.0024) PMDA (0.0451) | | BAPP (0.0474) | 212.5 (15) |
| A-11 | A-k (9,684) | PMDA (0.0648) | DDA (0.0065) | m-TB (0.0583) | 212.5 (15) |
| A-12 | A-l (12,300) | PMDA (0.0697) | | m-TB (0.0697) | 212.5 (15) |
| A-13 | A-m (12,145) | BPDA (0.0024) PMDA (0.0446) | DDA (0.0024) | BAPP (0.0446) | 212.5 (15) |

Example A-1

The polyamic acid solution A-a prepared in Synthesis Example A-1 was uniformly coated on one surface (surface roughness Rz: 2.1 μm) of an electrolytic copper foil having a thickness of 18 μm so that the thickness after curing became about 25 μm, and the resultant was then heated and dried at 120° C. to remove the solvent. Further, a stepwise heat treatment of from 120° C. to 360° C. was performed to complete imidization. For the obtained metal-clad laminate, the copper foil was removed by etching using a ferric chloride aqueous solution to obtain a resin film A-1. Moreover, the polyimide composing the resin film A-1 was non-thermoplastic.

The thermal expansion coefficient, Tg, dielectric constant and dielectric tangent of the resin film A-1 were calculated. Each measurement result is shown in Table 3.

Example A-2 and Reference Examples A-1 to A-4

Resin films A-2 to A-6 of Example A-2 and Reference Examples A-1 to A-4 were obtained in the same way as Example A-1 except that the polyamic acid solutions shown in Table 3 were used. The thermal expansion coefficient, Tg, dielectric constant and dielectric tangent of the obtained resin films A-2 to A-6 were calculated. Each measurement result is shown in Table 3.

Comparative Examples A-1 to A-5

Resin films of Comparative Examples A-1 to A-5 were obtained in the same way as Example A-1 except that the polyamic acid solutions shown in Table 4 were used. The thermal expansion coefficient, Tg, dielectric constant and dielectric tangent of the obtained resin films were calculated. Each measurement result is shown in Table 4.

The results of Examples A-1 to A-2, Reference Examples A-1 to A-4 and Comparative Examples A-1 to A-5 are summarized and shown in Tables 3 and 4. Moreover, in Tables 3 and 4, dielectric constant 1 and dielectric tangent 1 mean the measurement results of dielectric constant and dielectric tangent obtained by method 1, and dielectric constant 2 and dielectric tangent 2 mean those of dielectric constant and dielectric tangent obtained by method 2.

TABLE 3

|  |  | Example | | Reference Example | | | |
|---|---|---|---|---|---|---|---|
|  |  | A-1 | A-2 | A-1 | A-2 | A-3 | A-4 |
| Polyamic acid solution |  | A-a | A-b | A-c | A-h | A-i | A-m |
| Type of polyamide |  | Non-thermoplastic | Non-thermoplastic | Thermoplastic | Thermoplastic | Thermoplastic | Thermoplastic |
| CTE [ppm] |  | 6.73 | 16.20 | 82.00 | 56.60 | 104.40 | 50.1 |
| Tg [° C.] |  | 354 | 336 | 242 | 314 | 266 | 356 |
| 1 GHz | Dielectric constant 1 | 3.14 | 2.93 | 2.85 | 2.90 | 2.68 | not measured |
|  | Dielectric tangent 1 | 0.0041 | 0.0042 | 0.0017 | 0.0035 | 0.0023 | not measured |
| 3 GHz | Dielectric constant 1 | 3.10 | 3.00 | 2.70 | 2.91 | 2.68 | 3.08 |
|  | Dielectric tangent 1 | 0.0030 | 0.0032 | 0.0022 | 0.0043 | 0.0028 | 0.0042 |
| 10 GHz | Dielectric constant 1 | 2.95 | 2.89 | 2.60 | 2.75 | 2.54 | not measured |
|  | Dielectric tangent 1 | 0.0041 | 0.0035 | 0.0021 | 0.0047 | 0.0027 | not measured |
| 1 GHz | Dielectric constant 2 | not measured | 2.99 | 2.88 | not measured | not measured | not measured |
|  | Dielectric tangent 2 | not measured | 0.0011 | 0.0010 | not measured | not measured | not measured |

TABLE 4

|  |  | Comparative Example | | | | |
|---|---|---|---|---|---|---|
|  |  | A-1 | A-2 | A-3 | A-4 | A-5 |
| Polyamic acid solution |  | A-e | A-f | A-g | A-d | A-j |
| Type of polyamide |  | Non-thermoplastic | Non-thermoplastic | Non-thermoplastic | Non-thermoplastic | Thermoplastic |
| CTE [ppm] |  | 10.72 | not measured | 1.73 | 13.80 | 57.10 |
| Tg [° C.] |  | 384 | not measured | 394 | 382 | 320 |
| 1 GHz | Dielectric constant 1 | not measured | not measured | not measured | 3.19 | 2.99 |
|  | Dielectric tangent 1 | not measured | not measured | not measured | 0.0058 | 0.0091 |
| 3 GHz | Dielectric constant 1 | 3.19 | not measured | 3.22 | 3.17 | 3.01 |
|  | Dielectric tangent 1 | 0.0060 | not measured | 0.0061 | 0.0055 | 0.0123 |

TABLE 4-continued

| | | Comparative Example | | | | |
|---|---|---|---|---|---|---|
| | | A-1 | A-2 | A-3 | A-4 | A-5 |
| 10 GHz | Dielectric constant 1 | 3.02 | not measured | 3.02 | 2.97 | 2.82 |
| | Dielectric tangent 1 | 0.0077 | not measured | 0.0077 | 0.0076 | 0.0111 |
| 1 GHz | Dielectric constant 2 | 3.21 | 3.44 | 3.20 | 3.17 | not measured |
| | Dielectric tangent 2 | 0.0042 | 0.0108 | 0.0040 | 0.0020 | not measured |

Example A-3

A resin film A-7 was obtained in the same way as Example A-1 except that the polyamic acid solution A-k was used in place of the polyamic acid solution A-a in Example A-1. The dielectric constant and dielectric tangent of the obtained resin film A-7 at 10 GHz were 2.97 and 0.0025, respectively.

Comparative Example A-6

A resin film was obtained in the same way as Example A-1 except that the polyamic acid solution A-1 was used in place of the polyamic acid solution A-a in Example A-1. The dielectric constant and dielectric tangent of the obtained resin film at 10 GHz were 3.28 and 0.0102, respectively.

Example A-4

A polyimide film A-1 (made by Du Pont-Toray Co., Ltd.; trade name: Kapton EN; thickness: 25 μm) was prepared as the substrate, and the polyamic acid solution A-b was uniformly coated thereon so that the thickness after curing became about 25 μm. The resultant was then heated and dried at 120° C. to remove the solvent. Further, a stepwise heat treatment of from 120° C. to 360° C. was performed to complete imidization, so as to obtain a resin film A-8. The peel strength of the obtained resin film A-8 was measured. However, no peeling occurred.

Reference Example A-5

A resin film A-9 was obtained in the same way as Example A-4 except that the polyamic acid solution A-c was used in place of the polyamic acid solution A-b in Example A-4. The peel strength of the obtained resin film A-9 was 0.09 kN/m.

Reference Example A-6

The polyimide film A-1 was prepared as the substrate, and the polyamic acid solution A-h was uniformly coated thereon so that the thickness after curing became about 2 to 3 μm. The resultant was then heated and dried at 120° C. to remove the solvent. Next, the polyamic acid solution A-d was uniformly coated thereon so that the thickness after curing became about 25 μm. The resultant was heated and dried at 120° C. to remove the solvent. Further, a stepwise heat treatment of from 120° C. to 360° C. was performed to complete imidization, so as to obtain a resin film A-10. The peel strength of the obtained resin film A-10 was measured. However, no peeling occurred.

Reference Example A-7

A resin film A-11 was obtained in the same way as Reference Example A-6 except that the polyamic acid solution A-c was used in place of the polyamic acid solution A-h in Reference Example A-6. The peel strength of the obtained resin film A-11 was measured. However, no peeling occurred.

Reference Example A-8

The polyamic acid solution A-h was uniformly coated on one surface (surface roughness Rz: 1.39 μm) of an electrolytic copper foil having a thickness of 12 μm so that the thickness after curing became about 2 to 3 μm, and the resultant was then heated and dried at 120° C. to remove the solvent. Next, the polyamic acid solution A-d was uniformly coated thereon so that the thickness after curing became about 25 μm. The resultant was heated and dried at 120° C. to remove the solvent. Further, the polyamic acid solution A-h was uniformly coated thereon so that the thickness after curing became about 2 to 3 μm. The resultant was then heated and dried at 120° C. to remove the solvent. In this way, after a three-layered polyamic acid layer was formed, a stepwise heat treatment of from 120° C. to 360° C. was performed to complete imidization, so as to obtain a metal-clad laminate A-12. For the obtained metal-clad laminate A-12, the copper foil was removed by etching using a ferric chloride aqueous solution, so as to obtain a resin film A-12 having a thickness of about 30 μm. The obtained resin film A-12 had a thermal expansion coefficient of 21 ppm, a glass transition temperature of 358° C., and a dielectric constant of 3.00 and a dielectric tangent of 0.0066 at 10 GHz.

Reference Example A-9

A resin film A-13 was obtained in the same way as Reference Example A-8 except that the polyamic acid solution A-i was used in place of the polyamic acid solution A-h in Reference Example A-8. The dielectric constant and dielectric tangent of the obtained resin film A-13 at 10 GHz were 3.01 and 0.0061, respectively.

Comparative Example A-7

A resin film was obtained in the same way as Reference Example A-8 except that the polyamic acid solution A-j was used in place of the polyamic acid solution A-h in Reference Example A-8. The obtained resin film had a thermal expansion coefficient of 17 ppm, a Tg of 359° C., and a dielectric constant of 3.07 and a dielectric tangent of 0.0068 at 10 GHz.

Example A-5

A resin film A-14 was obtained in the same way as Reference Example A-8 except that the polyamic acid solution A-b was used in place of the polyamic acid solution A-d in Reference Example A-8. The obtained resin film A-14 had a thermal expansion coefficient of 24 ppm, a Tg of 326° C., and a dielectric constant of 2.83 and a dielectric tangent of 0.0031 at 10 GHz.

Example A-6

The polyamic acid solution A-h was uniformly coated on one surface (surface roughness Rz: 1.39 µm) of an electrolytic copper foil having a thickness of 12 µm so that the thickness after curing became about 2 to 3 µm, and the resultant was then dried by a stepwise heat treatment of from 85° C. to 110° C. to remove the solvent. Next, the polyamic acid solution A-b was uniformly coated thereon so that the thickness after curing became about 42 to 46 µm, and the solvent was removed by a stepwise heat treatment of from 85° C. to 110° C. Further, the polyamic acid solution A-h was uniformly coated thereon so that the thickness after curing became about 2 to 3 µm, and the solvent was then removed by a stepwise heat treatment of from 85° C. to 110° C. In this way, after a three-layered polyamic acid layer was formed, a stepwise heat treatment of from 120° C. to 320° C. was performed to complete imidization, so as to obtain a metal-clad laminate A-15. For the obtained metal-clad laminate A-15, the copper foil was removed by etching using a ferric chloride aqueous solution to obtain a resin film A-15 having a thickness of about 50 µm. The dielectric constant and dielectric tangent of the obtained resin film A-15 at 10 GHz were 2.86 and 0.0036, respectively. In addition, the total light transmittance and the haze of the resin film A-15 were 60.6% and 96.8%, respectively. The visibility was good. At this moment, light incidence onto the resin film A-15 occurred at the surface opposite to the surface from which the copper foil was removed by etching.

Reference Example A-10

A resin film A-16 was obtained in the same way as Example A-6 except that the polyamic acid solution A-d was used in place of the polyamic acid solution A-b in Example A-6. The dielectric constant and dielectric tangent of the obtained resin film A-16 at 10 GHz were 3.00 and 0.0073, respectively.

Example A-7

A resin film A-17 was obtained in the same way as Example A-6 except that the polyamic acid solution A-m was used in place of the polyamic acid solution A-h and the polyamic acid solution A-a was used in place of the polyamic acid solution A-b in Example A-6. The total light transmittance and the haze of the resin film A-17 were 59.9% and 97.4%, respectively. The visibility was good. At this moment, light incidence onto the resin film A-17 occurred at the surface opposite to the surface from which the copper foil was removed by etching. Moreover, when light was incident at the surface from which the copper foil was removed by etching, the total light transmittance and the haze of the resin film A-17 measured were 64.7% and 97.3%, respectively.

Comparative Example A-8

A resin film was obtained in the same way as Example A-6 except that the polyamic acid solution A-j was used in place of the polyamic acid solution A-h and the polyamic acid solution A-d used in place of the polyamic acid solution A-b in Example A-6. The dielectric constant and dielectric tangent of the obtained resin film at 10 GHz were 2.97 and 0.0088, respectively.

Example A-8

A copper foil A-1 (made by JX Nippon Oil & Energy Corporation; trade name: AMFN; electrolytic copper foil; thickness: 12 µm; surface roughness Rz of the resin laminate side: 2.22 µm; Ra: 0.38 µm) was prepared as the substrate, and the polyamic acid solution A-b was uniformly coated thereon so that the thickness after curing became about 28 µm. The resultant was then heated and dried at 120° C. to remove the solvent. Further, a stepwise heat treatment of from 120° C. to 360° C. was performed to complete imidization, so as to obtain a metal-clad laminate A-18. The peel strength of the obtained metal-clad laminate A-18 was 0.80 kN/m.

Reference Example A-11

A metal-clad laminate A-19 was obtained in the same way as Example A-8 except that the polyamic acid solution A-c was used in place of the polyamic acid solution A-b in Example A-8. The peel strength of the obtained metal-clad laminate A-19 was 0.74 kN/m.

Comparative Example A-9

A metal-clad laminate was obtained in the same way as Example A-8 except that the polyamic acid solution A-d was used in place of the polyamic acid solution A-b in Example A-8. The peel strength of the obtained metal-clad laminate was 0.28 kN/m.

Reference Example A-12

The copper foil A-1 was prepared as the substrate, and the polyamic acid solution A-h was uniformly coated thereon so that the thickness after curing became about 2 to 3 µm. The resultant was then heated and dried at 120° C. to remove the solvent. Next, the polyamic acid solution A-d was uniformly coated thereon so that the thickness after curing became about 27 to 28 µm. The resultant was then heated and dried at 120° C. to remove the solvent. Further, a stepwise heat treatment of from 120° C. to 360° C. was performed to complete imidization, so as to obtain a metal-clad laminate A-20. The peel strength of the obtained A-20 was 1.44 kN/m.

Reference Example A-13

A metal-clad laminate A-21 was obtained in the same way as Reference Example A-12 except that the polyamic acid solution A-c was used in place of the polyamic acid solution A-h in Reference Example A-12. The peel strength of the obtained A-21 was 1.49 kN/m.

Reference Example A-14

A copper foil A-2 (made by Nippon Denkai, Ltd.; trade name: HLB; electrolytic copper foil; thickness: 12 µm; surface roughness Rz of the resin laminate side: 1.39 µm; Ra: 0.20 µm) was prepared as the substrate. A metal-clad laminate A-22 was obtained in the same way as Reference Example A-12 except that the copper foil A-2 was used in place of the copper foil A-1 in Reference Example A-12. The peel strength of the obtained A-22 was 1.19 kN/m.

Reference Example A-15

A copper foil A-3 (made by Nippon Denkai, Ltd.; trade name: HLS-Type 2; electrolytic copper foil; thickness: 9 μm; surface roughness Rz of the resin laminate side: 1.06 μm; Ra: 0.16 μm) was prepared as the substrate. A metal-clad laminate A-23 was obtained in the same way as Reference Example A-12 except that the copper foil A-3 was used in place of the copper foil A-1 in Reference Example A-12. The peel strength of the obtained A-23 was 0.92 kN/m.

Comparative Example A-10

A metal-clad laminate was obtained in the same way as Reference Example A-12 except that the polyamic acid solution A-j was used in place of the polyamic acid solution A-h in Reference Example A-12. Peel strength of the obtained metal-clad laminate was 1.18 kN/m.

Example A-9

The copper foil A-1 was prepared as both a first and a second substrate. First of all, the polyamic acid solution A-h was uniformly coated on the first substrate so that the thickness after curing became about 2 to 3 μm. The resultant was then heated and dried at 120° C. to remove the solvent. Next, the polyamic acid solution A-b was uniformly coated thereon so that the thickness after curing became about 19 to 21 μm. The resultant was then heated and dried at 120° C. to remove the solvent. Further, the polyamic acid solution A-h was uniformly coated thereon so that the thickness after curing became about 2 to 3 μm. The resultant was then heated and dried at 120° C. to remove the solvent. In this way, after a three-layered polyamic acid layer was formed, a stepwise heat treatment of from 120° C. to 360° C. was performed to complete imidization, so as to obtain a metal-clad laminate A-24'. The second substrate was superimposed on the resin layer side of the obtained metal-clad laminate A-24', and the resultant was subjected to thermocompression bonding for 15 min at a temperature of 380° C. under a pressure of 6.7 MPa to obtain a metal-clad laminate A-24. Peel strength between the second substrate and the resin layer in the obtained metal-clad laminate A-24 was 0.96 kN/m.

Example A-10

The copper foil A-1 was prepared as the first substrate, and the copper foil A-2 was prepared as the second substrate. A metal-clad laminate A-25 was obtained in the same way as Example A-9 except that the copper foil A-2 was used in place of the copper foil A-1 as the second substrate in Example A-9. The peel strength between the second substrate and the resin layer in the obtained metal-clad laminate A-25 was 0.80 kN/m.

Example A-11

The copper foil A-1 was prepared as the first substrate, and a copper foil A-4 (made by Furukawa Electric Co., Ltd.; trade name: U-WZ; electrolytic copper foil; thickness: 12 μm; surface roughness Rz of the resin laminate side: 0.70 μm; Ra: 0.12 μm) was prepared as the second substrate. A metal-clad laminate A-26 was obtained in the same way as Example A-9 except that the copper foil A-4 was used in place of the copper foil A-1 as the second substrate in Example A-9. The peel strength between the second substrate and the resin layer in the obtained metal-clad laminate A-26 was 0.79 kN/m.

Example A-12

The copper foil A-1 was prepared as the first substrate, and a copper foil A-5 (made by Nippon Denkai, Ltd.; trade name: HLS; electrolytic copper foil; thickness: 12 μm; surface roughness Rz of the resin laminate side: 1.00 μm; Ra: 0.10 μm) was prepared as the second substrate. A metal-clad laminate A-27 was obtained in the same way as Example A-9 except that the copper foil A-5 was used in place of the copper foil A-1 as the second substrate in Example A-9. The peel strength between the second substrate and the resin layer in the obtained metal-clad laminate A-27 was 1.32 kN/m.

Example A-13

The copper foil A-2 was prepared as the first substrate, and the copper foil A-5 was prepared as the second substrate. First of all, the polyamic acid solution A-h was uniformly coated on the first substrate so that the thickness after curing became about 2 to 3 μm, and the solvent was then removed by a stepwise heat treatment of from 85° C. to 110° C. Next, the polyamic acid solution A-b was uniformly coated thereon so that the thickness after curing became about 42 to 46 μm, and the solvent was removed by a stepwise heat treatment of from 85° C. to 110° C. Further, the polyamic acid solution A-h was uniformally coated thereon so that the thickness after curing became about 2 to 3 μm, and the solvent was then removed by a stepwise heat treatment of from 85° C. to 110° C. In this way, after a three-layered polyamic acid layer was formed, a stepwise heat treatment of from 120° C. to 320° C. was performed to complete imidization, so as to obtain a metal-clad laminate A-28'. The second substrate was superimposed on the resin layer side of the obtained metal-clad laminate A-28', and the resultant was subjected to thermocompression bonding for 15 min at a temperature of 330° C. under a pressure of 6.7 MPa, so as to obtain a metal-clad laminate A-28. The peel strength between the second substrate and the resin layer in the obtained laminate A-28 was 0.96 kN/m.

Example A-14

The copper foil A-2 was prepared as the first substrate, and a copper foil A-3' (made by Nippon Denkai, Ltd.; trade name: HLS-Type 2; electrolytic copper foil; thickness: 12 μm; surface roughness Rz of the resin laminate side: 1.06 μm; Ra: 0.16 μm) was prepared as the second substrate. A metal-clad laminate A-29 was obtained in the same way as Example A-13 except that the copper foil A-3' was used in place of the copper foil A-5 as the second substrate in Example A-13. The peel strength between the second substrate and the resin layer in the obtained metal-clad laminate A-29 was 1.04 kN/m.

Reference Example A-16

A metal-clad laminate A-30' was obtained in the same way as Example A-13 except that the polyamic acid solution A-d was used in place of the polyamic acid solution A-b in Example A-13. The second substrate was superimposed on the resin layer side of the obtained metal-clad laminate A-30', and the resultant was subjected to thermocompression bonding for 15 min at a temperature of 330° C. under a pressure of 6.7 MPa to obtain a metal-clad laminate A-30. The peel strength between the second substrate and the resin layer in the obtained metal-clad laminate A-30 was 0.82 kN/m.

Comparative Example A-11

A metal-clad laminate was obtained in the same way as Example A-13 except that the polyamic acid solution A-j was used in place of the polyamic acid solution A-h and the polyamic acid solution A-d was used in place of the polyamic acid solution A-b in Example A-13. The second substrate was superimposed on the resin layer side of the obtained laminate, and the resultant was subjected to thermocompression bonding for 15 min at a temperature of 380° C. under a pressure of 6.7 MPa to obtain a metal-clad laminate. The peel strength between the second substrate and the resin layer in the obtained metal-clad laminate was 1.28 kN/m.

Test Example 1

Figure 2:
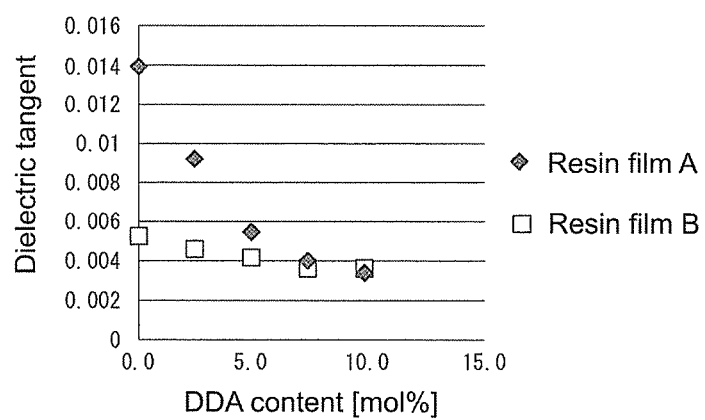
FIG. 2 is a graph showing measurement results of dielectric tangent in Test Example 1.

Discussion (1) of Blending Amount of DDA:
A polyamic acid was synthesized by changing the blending proportion of the DDA in the diamine component in accordance with the following two compositions, and a resin film was produced in the same way as Example A-1. The blending proportion X of the DDA was 0 mol %, 2.4 mol %, 4.9 mol %, 7.3 mol % or 9.8 mol %.
<Polyamic Acid Solution A/Resin Film A>
Anhydride component: PMDA (80 mol %) and BPDA (20 mol %)
Diamine component: m-TB (100-X mol %) and DDA (X mol %)
Solvent: DMAc
<Polyamic Acid Solution B/Resin Film B>
Anhydride component: PMDA (95 mol %) and BPDA (5 mol %)
Diamine component: BAPP (100-X mol %) and DDA (X mol %)
Solvent: DMAc
For the obtained resin film A and resin film B, the dielectric constant and dielectric tangent at 3 GHz were measured by method 1. The measurement result of dielectric constant is shown in FIG. 1, and the measurement result of dielectric tangent is shown in FIG. 2. It is clear from FIGS. 1 and 2 that the dielectric constant and dielectric tangent of the resin film A decrease sharply as the blending proportion of DDA in the diamine component was 4 mol % or more, and the dielectric constant and dielectric tangent of the resin film B became sufficiently low practically as the blending proportion in the diamine component was 4 mol % or more.

Test Example 2

Figure 3:
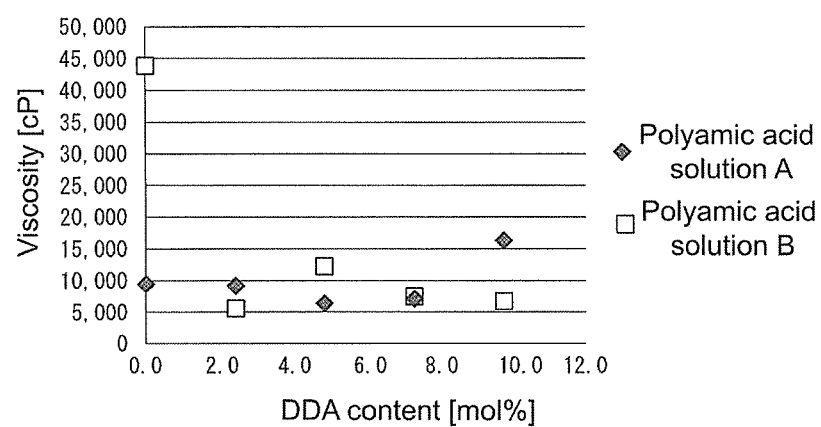
FIG. 3 is a graph showing measurement results of viscosity in Test Example 2.

Discussion (2) of Blending Amount of DDA:
For the polyamic acid solution A and the polyamic acid solution B that were synthesized in Test Example 1, the viscosity was measured. The results are shown in FIG. 3. It is clear from FIG. 3 that when the blending proportion of DDA was 4 mol % or more, both the polyamic acid solution A and the polyamic acid solution B had stable viscosity. Moreover, from another test, a result was obtained that when the blending proportion of DDA exceeded 40 mol %, the viscosity of the polyamic acid decreased sharply, and formation of a coating film by a cast method became difficult (the details are omitted).

In the following examples, unless specified otherwise, various measurements and evaluations are carried out in the following manners.

[Measurement of Dielectric Constant and Dielectric Tangent]
The measurement was carried out by method 1 above.

[Method for Evaluating Flame Retardancy]
The evaluation of flame retardancy was carried out in the following manner. A polyimide film was cut into a sample of 125±5 mm×13±0.5 mm, a test piece was produced and a combustion test was conducted in accordance with the UL94V standard. When the V-0 criteria were met, the flame retardancy was evaluated as "©"; when not met, the flame retardancy was evaluated as "x".

[Measurement of Moisture Absorptivity]
The moisture absorptivity was measured by the following procedure. Two test pieces (having a width of 4 cm and a length of 25 cm) were prepared from a film-shaped sample which was produced in the same way as in the evaluation of the thermal expansion coefficient (CTE), and dried at 80° C. for 1 hour. Immediately after the drying, the test pieces were placed in a constant temperature and humidity chamber (23° C., 50% RH) and left to stand for 24 hours or longer. From the change in weight before and after the aforementioned step, the moisture absorptivity was calculated by the following equation.

Moisture absorptivity (mass %)=[(weight before the moisture absorption−weight after the drying)/ weight after the drying]×100

[Calculation of Imide Group Concentration]
A value obtained by dividing the molecular weight of the imide group (—(CO)$_2$—N—) by the molecular weight of the entire polyimide structure was taken as the imide group concentration.

The abbreviations used in Examples and Comparative Examples indicate the following compounds.
DDA: dimer acid-type diamine (made by Croda Japan KK; trade name: Priamine 1074; carbon number: 36; amine value: 210 mgKOH/g; content of dimer component: 95 wt % or more)
m-TB: 2,2'-dimethyl-4,4'-diaminobiphenyl
BAPP: 2,2-bis(4-aminophenoxyphenyl)propane
TPE-R: 1,3-bis(4-aminophenoxy)benzene
o-tolidine: 4,4'-diamino-3,3'-dimethylbiphenyl
TFMB: 4,4'-diamino-2,2'-bis(trifluoromethyl)biphenyl
PMDA: pyromellitic dianhydride
BPDA: 3,3',4,4'-biphenyl tetracarboxylic dianhydride
NTCDA: 1,4,5,8-naphthalenetetracarboxylic dianhydride
DMAc: N,N-dimethylacetamide Synthesis Example B-1

Under a nitrogen gas stream, 0.63 g of DDA (0.0012 mol), 16.42 g of m-TB (0.077 mol) and 212.5 g of DMAc were put into a 300 ml separable flask, and dissolved by stirring at room temperature. Next, 13.68 g of BPDA (0.046 mol) and 6.77 g of PMDA (0.031 mol) were added, and then the mixture was continuously stirred at room temperature for 3 hours to perform a polymerization reaction, and a polyamic acid solution B-a was obtained. The polyamic acid solution B-a had a solution viscosity of 49500 cps.

Synthesis Examples B-2 to B-18

Polyamic acid solutions B-b to B-r were prepared in the same way as Synthesis Example B-1 except that the raw material compositions shown in Tables 5 and 6 were employed.

performed to complete imidization. At this moment, the imide group concentration was 31.5%. For the obtained metal-clad laminate, the copper foil was removed by etching using a ferric chloride aqueous solution to obtain a resin film B-1. The thermal expansion coefficient, Tg, moisture

TABLE 5

| Synthesis Example | Polyamic acid solution (cps) | Anhydride component Aromatic tetracarboxylic acid (mol) | Diamine component Aromatic diamine (mol) | Diamine component Aliphatic diamine (mol) | Solvent DMAc [g] (solid content; mass %) |
|---|---|---|---|---|---|
| B-1 | B-a (49500) | PMDA (0.031) BPDA (0.046) | m-TB (0.077) | DDA (0.0012) | 212.5 (15) |
| B-2 | B-b (47500) | PMDA (0.031) BPDA (0.046) | m-TB (0.075) | DDA (0.0023) | 212.5 (15) |
| B-3 | B-c (38200) | PMDA (0.077) | m-TB (0.031) TPE-R (0.044) | DDA (0.0023) | 212.5 (15) |
| B-4 | B-d (41600) | PMDA (0.078) | m-TB (0.039) TPE-R (0.037) | DDA (0.0023) | 212.5 (15) |
| B-5 | B-e (42800) | NTCDA (0.060) BPDA (0.015) | m-TB (0.074) | DDA (0.0023) | 212.5 (15) |
| B-6 | B-f (49100) | PMDA (0.031) BPDA (0.046) | o-tolidine (0.075) | DDA (0.0023) | 212.5 (15) |
| B-7 | B-g (31100) | PMDA (0.025) BPDA (0.038) | TFMB (0.062) | DDA (0.0019) | 212.5 (15) |
| B-8 | B-h (41100) | PMDA (0.015) NTCDA (0.015) BPDA (0.045) | m-TB (0.074) | DDA (0.0023) | 212.5 (15) |
| B-9 | B-i (32300) | PMDA (0.029) BPDA (0.043) | m-TB (0.043) TFMB (0.027) | DDA (0.0022) | 212.5 (15) |
| B-10 | B-j (33600) | PMDA (0.031) BPDA (0.046) | m-TB (0.047) o-tolidine (0.029) | DDA (0.0023) | 212.5 (15) |

TABLE 6

| Synthesis Example | Polyamic acid solution (cps) | Anhydride component Aromatic tetracarboxylic acid (mol) | Diamine component Aromatic diamine (mol) | Diamine component Aliphatic diamine (mol) | Solvent DMAc [g] (solid content; mass %) |
|---|---|---|---|---|---|
| B-11 | B-k (29600) | PMDA (0.027) BPDA (0.041) | TFMB (0.041) o-tolidine (0.025) | DDA (0.0021) | 212.5 (15) |
| B-12 | B-l (34100) | PMDA (0.037) NTCDA (0.037) | m-TB (0.028) TFMB (0.023) o-tolidine (0.023) | DDA (0.0023) | 212.5 (15) |
| B-13 | B-m (41100) | PMDA (0.078) | m-TB (0.031) TPE-R (0.047) | — | 212.5 (15) |
| B-14 | B-n (32000) | PMDA (0.031) BPDA (0.047) | m-TB (0.079) | — | 212.5 (15) |
| B-15 | B-o (29500) | PMDA (0.064) BPDA (0.016) | m-TB (0.078) | DDA (0.0041) | 212.5 (15) |
| B-16 | B-p (28700) | PMDA (0.063) BPDA (0.016) | m-TB (0.074) | DDA (0.0060) | 212.5 (15) |
| B-17 | B-q (28600) | PMDA (0.062) BPDA (0.016) | m-TB (0.071) | DDA (0.0079) | 212.5 (15) |
| B-18 | B-r (2110) | PMDA (0.060) | BAPP (0.058) | — | 212.4 (12) |

Example B-1

The polyamic acid solution B-a obtained in Synthesis Example B-1 was uniformly coated on one surface (surface roughness Rz: 1.5 μm) of an electrolytic copper foil having a thickness of 12 μm so that the thickness after curing became about 42 to 46 μm, and the resultant was then heated and dried at 120° C. to remove the solvent. Further, a stepwise heat treatment of from 120° C. to 360° C. was absorptivity, dielectric constant, dielectric tangent, and the evaluation result of flame retardancy of the resin film B-1 are shown in Table 7.

Examples B-2 to B-6

Resin films B-2 to B-6 were produced in the same way as Example B-1 using the polyamic acid solutions described in Table 7. The imide group concentration, thermal expansion coefficient, Tg, moisture absorptivity, dielectric constant, dielectric tangent, and the evaluation result of flame retardancy of each resin film are shown in Table 7.

Examples B-7 to B-12

Resin films B-7 to B-12 were produced in the same way as Example B-1 using the polyamic acid solutions described in Table 8. The imide group concentration, thermal expansion coefficient, Tg, moisture absorptivity, dielectric constant, dielectric tangent, and the evaluation result of flame retardancy of each resin film are shown in Table 8.

Comparative Examples B-1 to B-2

Resin films B-C1 and B-C2 were produced in the same way as Example B-1 using the polyamic acid solutions described in Table 9. The imide group concentration, thermal expansion coefficient, Tg, moisture absorptivity, dielectric constant, dielectric tangent, and the evaluation result of flame retardancy of each resin film are shown in Table 9.

Reference Examples B-1 to B-3

Resin films B-R1 to B-R3 were produced in the same way as Example B-1 using the polyamic acid solutions described in Table 9. The imide group concentration, thermal expansion coefficient, Tg, moisture absorptivity, dielectric constant, dielectric tangent, and the evaluation result of flame retardancy of each resin film are shown in Table 9.

The results of Examples B-1 to B-12, Comparative Examples B-1 to B-2 and Reference Examples B-1 to B-3 are summarized and shown in Tables 7 to 9.

TABLE 7

| | Example | | | | | |
|---|---|---|---|---|---|---|
| | B-1 | B-2 | B-3 | B-4 | B-5 | B-6 |
| Polyamic acid solution | B-a | B-b | B-c | B-d | B-e | B-f |
| Imide group concentration (%) | 31.5 | 31.1 | 31.1 | 31.7 | 30.5 | 31.1 |
| CTE [ppm/K] | 10.9 | 11.4 | 29.7 | 27.1 | 2.6 | 8.7 |
| Tg [° C.] | 324.8 | 308.1 | 306 | 331 | 398 | 316 |
| Moisture absorptivity [%] | 0.51 | 0.39 | 0.49 | 0.63 | 0.37 | 0.31 |
| Cavity resonance method (3 GHz) Dielectric constant | 3.18 | 3.21 | 3.26 | 3.28 | 3.3 | 3.11 |
| Dielectric tangent | 0.0037 | 0.0032 | 0.0034 | 0.0039 | 0.0031 | 0.0030 |
| Flame retardancy | ◎ | ◎ | ◎ | ◎ | ◎ | ◎ |

TABLE 8

| | Example | | | | | |
|---|---|---|---|---|---|---|
| | B-7 | B-8 | B-9 | B-10 | B-11 | B-12 |
| Polyamic acid solution | B-g | B-h | B-i | B-j | B-k | B-l |
| Imide group concentration (%) | 25.3 | 30.4 | 28.6 | 31.1 | 27.2 | 30.3 |
| CTE [ppm/K] | 18.9 | 9.8 | 16.9 | 10.1 | 14.8 | 6.3 |
| Tg [° C.] | 301.7 | 314.5 | 304.8 | 312.7 | 302.6 | 389.9 |
| Moisture absorptivity [%] | 0.34 | 0.37 | 0.36 | 0.37 | 0.34 | 0.41 |
| Cavity resonance method (3 GHz) Dielectric constant | 3.01 | 3.29 | 3.09 | 3.25 | 3.09 | 3.21 |
| Dielectric tangent | 0.0039 | 0.0030 | 0.0038 | 0.0031 | 0.0037 | 0.0039 |
| Flame retardancy | ◎ | ◎ | ◎ | ◎ | ◎ | ◎ |

TABLE 9

| | Comparative Example | | Reference Example | | |
|---|---|---|---|---|---|
| | B-1 | B-2 | B-1 | B-2 | B-3 |
| Polyamic acid solution | B-m | B-n | B-o | B-p | B-q |
| Imide group concentration (%) | 31.6 | 31.8 | 32.8 | 32.2 | 31.6 |
| CTE [ppm/K] | 29.7 | 7.2 | 6.7 | 8.2 | 10.8 |
| Tg [° C.] | 328 | 338 | 354 | 340 | 332 |
| Moisture absorptivity [%] | 0.56 | 0.68 | 1.07 | 0.88 | 0.68 |
| Cavity resonance method (3 GHz) Dielectric constant | 3.34 | 3.26 | 3.23 | 3.32 | 3.15 |
| Dielectric tangent | 0.0041 | 0.004 | 0.005 | 0.0042 | 0.004 |
| Flame retardancy | ◎ | ◎ | ◎ | x | x |

Example B-13

<Preparation of Metal-Clad Laminate>

The polyamic acid solution B-r was uniformly coated on a copper foil B-13 (electrolytic copper foil; thickness: 12 μm; surface roughness Rz of the resin laminate side: 1.39 μm) so that the thickness after curing became about 2 to 4 μm, and the solvent was then removed by a stepwise heat treatment of from 85° C. to 110° C. Next, the polyamic acid solution B-a used in Example B-1 was uniformly coated thereon so that the thickness after curing became about 42 to 46 μm, and the solvent was removed by a stepwise heat treatment of from 85° C. to 110° C. Further, the polyamic acid solution B-r was uniformly coated thereon so that the thickness after curing became about 2 to 4 μm, and the solvent was then removed by a stepwise heat treatment of from 85° C. to 110° C. In this way, after a three-layered polyamic acid layer was formed, a stepwise heat treatment of from 120° C. to 360° C. was performed to complete imidization, so as to obtain a metal-clad laminate B-13'. The copper foil B-13 was superimposed on the resin layer side of the obtained metal-clad laminate, and the resultant was subjected to thermocompression bonding for 15 min at a temperature of 340° C. under a pressure of 6.7 MPa to obtain a metal-clad laminate B-13. For the obtained metal-clad laminate B-13, the copper foil was removed by etching using a ferric chloride aqueous solution to obtain a resin film B-13.

Example B-14

A metal-clad laminate B-14', a metal-clad laminate B-14 and a resin film B-14 were obtained in the same way as Example B-13 except that the polyamic acid solution B-b was used in place of the polyamic acid solution B-a in Example B-13.

Example B-15

A metal-clad laminate B-15', a metal-clad laminate B-15 and a resin film B-15 were obtained in the same way as Example B-13 except that the polyamic acid solution B-c was used in place of the polyamic acid solution B-a in Example B-13.

Example B-16

A metal-clad laminate B-16', a metal-clad laminate B-16 and a resin film B-16 were obtained in the same way as Example B-13 except that the polyamic acid solution B-d was used in place of the polyamic acid solution B-a in Example B-13.

Example B-17

A metal-clad laminate B-17', a metal-clad laminate B-17 and a resin film B-17 were obtained in the same way as Example B-13 except that the polyamic acid solution B-e was used in place of the polyamic acid solution B-a in Example B-13.

Example B-18

A metal-clad laminate B-18', a metal-clad laminate B-18 and a resin film B-18 were obtained in the same way as Example B-13 except that the polyamic acid solution B-f was used in place of the polyamic acid solution B-a in Example B-13.

Example B-19

A metal-clad laminate B-19', a metal-clad laminate B-19 and a resin film B-19 were obtained in the same way as Example B-13 except that the polyamic acid solution B-g was used in place of the polyamic acid solution B-a in Example B-13.

Example B-20

A metal-clad laminate B-20', a metal-clad laminate B-20 and a resin film B-20 were obtained in the same way as Example B-13 except that the polyamic acid solution B-h was used in place of the polyamic acid solution B-a in Example B-13.

Example B-21

A metal-clad laminate B-21', a metal-clad laminate B-21 and a resin film B-21 were obtained in the same way as Example B-13 except that the polyamic acid solution B-i was used in place of the polyamic acid solution B-a in Example B-13.

Example B-22

A metal-clad laminate B-22', a metal-clad laminate B-22 and a resin film B-22 were obtained in the same way as Example B-13 except that the polyamic acid solution B-j was used in place of the polyamic acid solution B-a in Example B-13.

Example B-23

A metal-clad laminate B-23', a metal-clad laminate B-23 and a resin film B-23 were obtained in the same way as Example B-13 except that the polyamic acid solution B-k was used in place of the polyamic acid solution B-a in Example B-13.

Example B-24

A metal-clad laminate B-24', a metal-clad laminate B-24 and a resin film B-24 were obtained in the same way as Example B-13 except that the polyamic acid solution B-l was used in place of the polyamic acid solution B-a in Example B-13.

Although embodiments of the invention have been described in detail for the purpose of illustration, the invention is not limited to the aforementioned embodiments and can be modified in various ways.

What is claimed is:
1. A resin film having one or a plurality of polyimide layers, wherein
at least one of the polyimide layers is a non-thermoplastic polyimide layer having a linear thermal expansion coefficient of $1 \times 10^{-6}$ to $30 \times 10^{-6}$ (1/K), wherein
the non-thermoplastic polyimide layer is composed of a polyimide which is produced by reacting an anhydride component comprising an aromatic tetracarboxylic anhydride with a diamine component, wherein the diamine component comprises both a dimer acid-type diamine produced by replacing each of two terminal carboxyl groups in a dimer acid with a primary aminomethyl or amino group and an aromatic diamine, and the dimer acid-type diamine is contained in an amount of 1 to 15 mol % relative to the whole diamine component, and the non-thermoplastic polyimide layer is a base film layer, and the resin film comprises a thermoplastic polyimide layer laminated on the base film layer.

2. The resin film of claim 1, wherein the dimer acid-type diamine is contained in an amount of 4 to 15 mol % relative to the whole diamine component.

3. The resin film of claim 1, wherein the aromatic tetracarboxylic anhydride is one or more selected from the group consisting of pyromellitic dianhydride (PMDA), 3,3',4,4'-biphenyl tetracarboxylic dianhydride (BPDA), 3,3',4,4'-benzophenone tetracarboxylic dianhydride (BTDA) and 3,3',4,4'-diphenylsulfonetetracarboxylic dianhydride (DSDA).

4. The resin film of claim 1, wherein the aromatic diamine is one or more selected from the group consisting of 2,2'-divinyl-4,4'-diaminobiphenyl (VAB), 2,2'-dimethyl-4,4'-diaminobiphenyl (m-TB), 2,2'-diethyl-4,4'-diaminobiphenyl, 2,2',6,6'-tetramethyl-4,4'-diaminobiphenyl, 2,2'-diphenyl-4,4'-diaminobiphenyl and 9,9-bis(4-aminophenyl)fluorene.

5. The resin film of claim 1, wherein the thermoplastic polyimide layer is composed of a polyimide which is produced by reacting an anhydride component comprising an aromatic tetracarboxylic anhydride with a diamine component, wherein the diamine component comprises both a dimer acid-type diamine produced by replacing each of two terminal carboxyl groups in a dimer acid with a primary aminomethyl or amino group and an aromatic diamine, and the dimer acid-type diamine is contained in an amount of 1 to 15 mol % relative to the whole diamine component.

* * * * *